(12) United States Patent
Calderoni et al.

(10) Patent No.: US 10,978,128 B2
(45) Date of Patent: *Apr. 13, 2021

(54) MEMORY CELL IMPRINT AVOIDANCE

(71) Applicant: Micron Technology, Inc., Boise, ID (US)

(72) Inventors: Alessandro Calderoni, Boise, ID (US); Durai Vishak Nirmal Ramaswamy, Boise, ID (US); Kirk Prall, Boise, ID (US); Ferdinando Bedeschi, Biassono (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/586,334

(22) Filed: Sep. 27, 2019

(65) Prior Publication Data

US 2020/0090728 A1    Mar. 19, 2020

Related U.S. Application Data

(63) Continuation of application No. 16/111,021, filed on Aug. 23, 2018, now Pat. No. 10,475,500, which is a
(Continued)

(51) Int. Cl.
*G11C 11/22* (2006.01)
*G11C 29/52* (2006.01)
*G06F 11/10* (2006.01)

(52) U.S. Cl.
CPC ...... *G11C 11/2275* (2013.01); *G06F 11/1048* (2013.01); *G06F 11/1068* (2013.01);
(Continued)

(58) Field of Classification Search
CPC ..... G11C 16/0483; G11C 16/10; G11C 16/26; G11C 16/08; G11C 11/5628;
(Continued)

(56) References Cited

U.S. PATENT DOCUMENTS 5,525,528 A   6/1996  Perino et al.
6,246,603 B1  6/2001  Brady
(Continued)

FOREIGN PATENT DOCUMENTS

CN   1117192 A   2/1996
CN   1620698 A   5/2005
(Continued)

OTHER PUBLICATIONS

Intellectual Property Office of Singapore, "Written Opinion," issued in connection with Application No. 10201811065S, dated Sep. 16, 2019 (6 pages).
(Continued)

*Primary Examiner* — Thong Q Le
(74) *Attorney, Agent, or Firm* — Holland & Hart LLP

(57) ABSTRACT

Methods, systems, and devices for operating a ferroelectric memory cell or cells are described. A cell may be written with a value that is intended to convey a different logic state than may typically be associated with the value. For example, a cell that has stored a charge associated with one logic state for a time period may be re-written to store a different charge, and the re-written cell may still be read to have the originally stored logic state. An indicator may be stored in a latch to indicate whether the logic state currently stored by the cell is the intended logic state of the cell. A cell may, for example, be re-written with an opposite value periodically, based on the occurrence of an event, or based on a determination that the cell has stored one value (or charge) for a certain time period.

20 Claims, 8 Drawing Sheets

Related U.S. Application Data continuation of application No. 15/645,106, filed on Jul. 10, 2017, now Pat. No. 10,083,732, which is a continuation of application No. 15/188,886, filed on Jun. 21, 2016, now Pat. No. 9,721,639.

(52) U.S. Cl.
CPC ........ *G11C 11/221* (2013.01); *G11C 11/2273* (2013.01); *G11C 29/52* (2013.01)

(58) Field of Classification Search
CPC ... G11C 13/004; G11C 29/52; G11C 11/4087; G11C 11/4091; G11C 11/5642; G11C 16/24; G11C 13/0069; G11C 11/221; G11C 11/2273; G11C 11/2275; G11C 7/1006; G11C 7/04; G06F 11/1048; G06F 11/1068; G06F 21/10; G06F 21/552; G06F 21/77; G06F 2221/0797; G06F 2221/2105; G06F 2221/2151; G06F 2221/2153; G06F 13/385; G06F 13/4295; G06F 1/3203; G06F 3/16

See application file for complete search history.

(56) References Cited

U.S. PATENT DOCUMENTS

| | | | |
|---|---|---|---|
| 6,590,798 | B1 | 7/2003 | Komatsuzaki |
| 6,781,864 | B2 | 8/2004 | Basceri et al. |
| 6,982,908 | B2 | 1/2006 | Cho |
| 7,266,008 | B2 | 9/2007 | Gudesen et al. |
| 8,059,445 | B2 | 11/2011 | Hashimoto et al. |
| 8,514,631 | B2 | 8/2013 | Morton et al. |
| 8,910,000 | B2 | 12/2014 | Bedeschi |
| 8,971,105 | B2 | 3/2015 | Bedeschi |
| 9,001,575 | B2 | 4/2015 | Bedeschi |
| 9,105,314 | B2 | 8/2015 | Bedeschi |
| 9,524,782 | B2 | 12/2016 | Lee et al. |
| 9,601,177 | B2 | 3/2017 | Kimura |
| 9,721,639 | B1 | 8/2017 | Calderoni et al. |
| 10,475,500 | B2 * | 11/2019 | Calderoni ........... G06F 11/1068 |
| 2003/0112651 | A1 | 6/2003 | Basceri et al. |
| 2003/0137864 | A1 | 7/2003 | Holden et al. |
| 2004/0264237 | A1 | 12/2004 | Perner |
| 2005/0099855 | A1 | 5/2005 | Holden et al. |
| 2005/0128779 | A1 | 6/2005 | Roehr et al. |
| 2006/0002171 | A1 | 1/2006 | Gudesen et al. |
| 2007/0035983 | A1 | 2/2007 | Lee et al. |
| 2008/0068873 | A1 | 3/2008 | Matsuno et al. |
| 2010/0157650 | A1 | 6/2010 | Hashimoto et al. |
| 2011/0202948 | A1 * | 8/2011 | Bildgen ............ H04N 21/4181 725/14 |
| 2014/0146625 | A1 | 5/2014 | Kurjanowicz et al. |
| 2015/0155046 | A1 | 6/2015 | Lee et al. |
| 2015/0255138 | A1 | 9/2015 | Rodriguez-latorre et al. |
| 2016/0163383 | A1 | 6/2016 | Tortorelli et al. |

FOREIGN PATENT DOCUMENTS

| | | |
|---|---|---|
| CN | 1637933 A | 7/2005 |
| JP | H10241375 A | 9/1998 |
| JP | 2008071440 A | 3/2008 |
| KR | 20020003100 A | 1/2002 |
| WO | 2006073308 A1 | 7/2006 |
| WO | 2013108456 A1 | 7/2013 |

OTHER PUBLICATIONS

European Patent Office, "European Search Report," issued in connection with European Patent Application No. 17815913.3 , dated Jan. 30, 2020 (7 pages).

China National Intellectual Property Administration, "Office Action," issued in connection with Chinese Patent Application No. 201780038707.3, dated Jul. 11, 2019 (11 pages).

ISA/KR, International Search Report and Written Opinion of the International Searching Authority, Int'l. Appl. No. PCT/US2017/035758, dated Sep. 7, 2017, Korean Intellectual Property Office, Seo-gu, Daejeon, Republic of Korea, 12 pages.

JPO, "Notice of Rejection Ground," issued in connection with Japanese Patent Application No. 2018-566450, dated Jun. 23, 2020 (5 pages).

KIPO, "Notice of Reasons for Rejection," issued in connection with Korean Patent Application No. 10-2019-7001496, dated May 25, 2020 (7 pages).

* cited by examiner

MEMORY CELL IMPRINT AVOIDANCE

CROSS REFERENCE

The present application for patent is a continuation of U.S. patent application Ser. No. 16/111,021 by Calderoni et al., entitled "Memory Cell Imprint Avoidance," filed Aug. 23, 2018, which is a continuation of U.S. patent application Ser. No. 15/645,106 by Calderoni et al., entitled "Memory Cell Imprint Avoidance," filed Jul. 10, 2017, which is a continuation of U.S. patent application Ser. No. 15/188,886 by Calderoni et al., entitled "Memory Cell Imprint Avoidance," filed Jun. 21, 2016, assigned to the assignee hereof, and each of which is expressly incorporated by reference in its entirety herein.

BACKGROUND

The following relates generally to memory devices and more specifically to maintaining the performance of ferroelectric memory cells that store logic values for extended periods of time.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory (e.g., flash memory) can store data for extended periods of time even in the absence of an external power source. Volatile memory devices (e.g., DRAM) may lose their stored state over time unless they are periodically refreshed by an external power source. A binary memory device may, for example, include a charged or discharged capacitor. A charged capacitor may, however, become discharged over time through leakage currents, resulting in the loss of the stored information. Certain features of volatile memory may offer performance advantages, such as faster read or write speeds, while features of non-volatile memory, such as the ability to store data without periodic refreshing, may be advantageous.

FeRAM may use similar device architectures as volatile memory but may have non-volatile properties due to the use of a ferroelectric capacitor as a storage device. FeRAM devices may thus have improved performance compared to other non-volatile and volatile memory devices. A ferroelectric memory cell of the FeRAM device may store a logic state (e.g., logic 1) for an extended period of time (e.g., hours, days, months, etc.). Over this period of time, ferroelectric domains within a ferroelectric capacitor of the ferroelectric memory cell may shift, the magnitude and effects of which may increase with time. As a result of this shifting, the ferroelectric memory cell may experience degraded performance during subsequent write or read operations.

BRIEF DESCRIPTION OF THE DRAWINGS

The disclosure herein refers to and includes the following figures.

DETAILED DESCRIPTION

Figure 1:
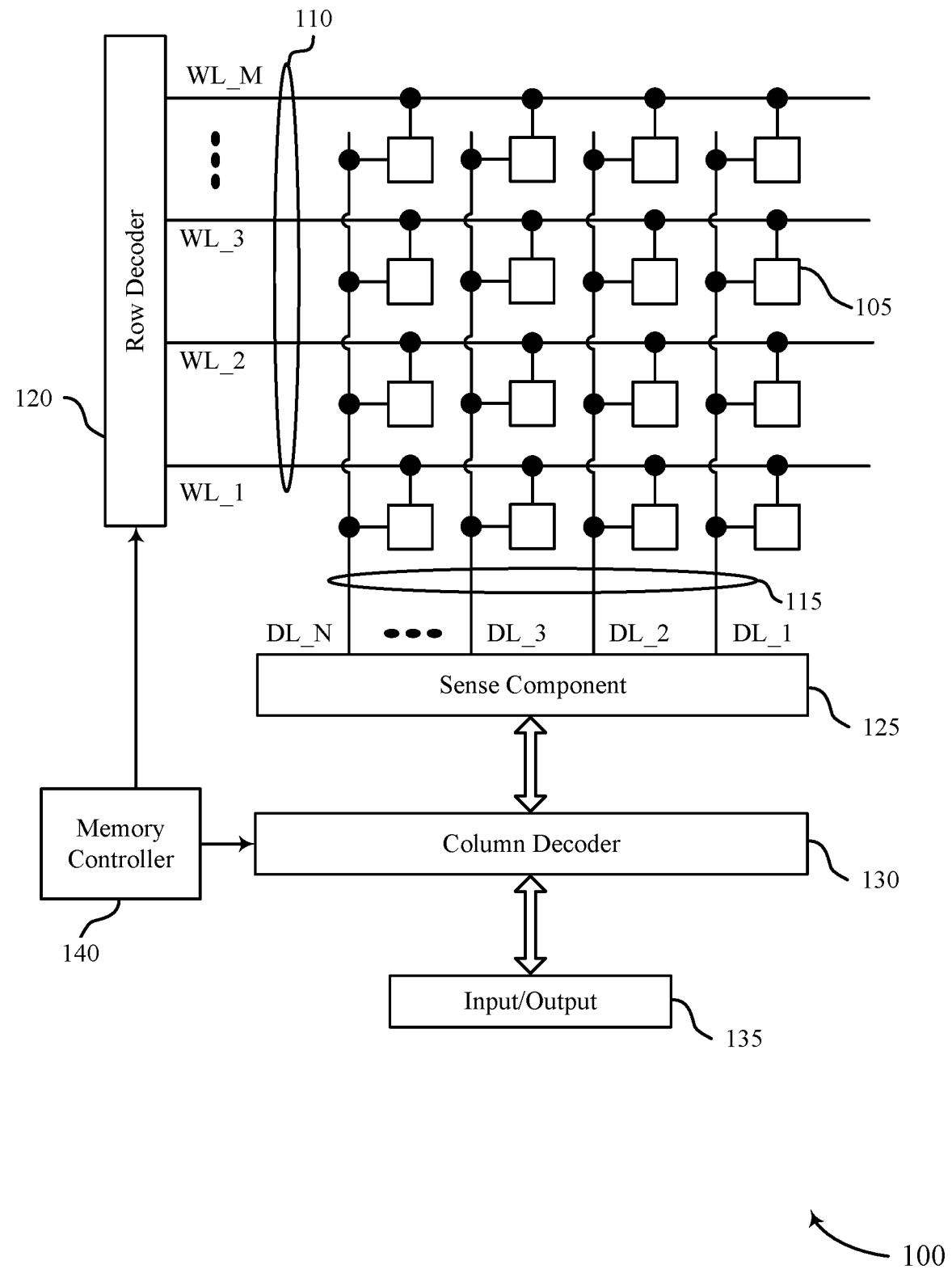
FIG. 1 illustrates an example memory array that supports avoiding imprint of a memory cell in accordance with various embodiments of the present disclosure.

A ferroelectric memory cell may be written with a value that is intended to convey a different logic state than may typically be associated with the value to mitigate the effects of shifting ferroelectric domains. For instance, a cell that has stored a charge associated with one logic state for a time period may be re-written to store a different charge, and the re-written cell may still be read to have the originally stored logic state. A cell may, for example, be re-written with an opposite value periodically, based on the occurrence of an event, or based on a determination that the cell has stored one value (or charge) for a certain time period. An indicator may be stored (e.g., in a latch), which may indicate whether the logic state currently stored by the cell is the intended logic state of the cell.

By way of example, an initial logic state (e.g., a logic "1") may be written to and stored by a memory cell. Subsequent access operations (e.g., read or write operations) may not be scheduled for the memory cell for an extended period of time (e.g., hours, days, months, etc.) after storage of the initial logic state; or the same logic value may be consecutively written to the memory cell for the extended period. As a result, ferroelectric domains within a ferroelectric capacitor of the memory cell may shift. This phenomenon may be referred to as "imprint."

To mitigate the effects of imprint, a determination may be made that the memory cell has stored the initial logic state for a certain amount of time, that an event has occurred, or that the cell has been consecutively written with the same value for some time period, and an opposite value may be written to the cell. The intended logic state of the cell may nevertheless remain unchanged. So if the initial logic state of the cell is "1," and if after a determined time period, the cell is re-written with a logic "0," the intended state of the cell may be, and the cell may be read as storing, a logic "1."

In some cases, a timer may be initiated when the initial logic state is stored, and a current value of the timer may be compared with a pre-determined or dynamically configured value that corresponds to a configured time period. The configured time period may be shorter than a time period expected to result in imprinting of a cell, and in some examples may be on the order of seconds or minutes. In some cases, the value corresponding to the time period may be determined based on internal characteristics of the memory cell, a temperature of the memory cell, an age of the memory cell, a sensing window resulting from reading the memory cell, and the like.

Upon determining the time period has elapsed, a different logic state (e.g., the opposite logic 0 state)—relative to the initially stored logic state—may be written to the memory cell. Concurrently, an indicator stored in a latch (e.g., a non-volatile memory cell) may be updated from one value (e.g., "0") to another value (e.g., "1"). The value of the indicator may be indicative of whether the logic state currently stored by the memory cell is the logic state intended to be read from the memory cell or is different than the logic state intended to be read from the memory cell. For instance, an indicator value of 0 may be used to indicate that the intended logic state of the memory cell is the same as the logic state currently stored by the memory cell, while an indicator value of 1 may be used to indicate the intended logic state of the memory cell is the opposite of the logic state stored by the memory cell. In some examples, logic 0 may be considered as the opposite of logic 1.

In another example, the different logic state may be written to the memory cell and the indicator updated in response to a certain event. For instance, the different logic state may be written after a certain number of read/write errors have been detected. In another case, the different logic state may be written in response to a device returning from a low power state or a powered down state, in response to the device being plugged into an external power source, or in response to an input from a user operating the device.

In some cases, the value of the indicator may be provided to a sense component, and the sense component may sense the logic state currently stored at the memory cell (e.g., logic 0). The sense component may use the sensed logic state and the value of the indicator (e.g., 1) to determine that the opposite state of the sensed logic state is the logic state intended to be read from the memory cell (e.g., the initially stored logic 1 state). In other examples, the value of the indicator may be provided to an error correction code (ECC) component and used in identifying a codeword from a read operation of a memory array including the memory cell, and the value of the codeword may be used to determine the intended logic state. Although discussed in the context of a single memory cell, features of the above discussion may be implemented across multiple memory cells, as will be described in more detail below.

Features of the disclosure introduced above are further described below in the context of a memory array. Specific examples are then described for an example circuit with a corresponding diagram for avoiding imprint of a memory cell. These and other features of the disclosure are further illustrated by and described with reference to apparatus diagrams, system diagrams, and flowcharts that relate to avoiding imprint of a memory cell.

FIG. 1 illustrates an example memory array 100 that supports avoiding imprint of a memory cell in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted as a logic 0 and a logic 1. In some cases, memory cell 105 is configured to store more than two logic states. A memory cell 105 may include a capacitor to store a charge representative of the programmable states; for example, a charged and uncharged capacitor may represent two logic states, respectively.

DRAM architectures may commonly use such a design, and the capacitor employed may include a dielectric material with linear electric polarization properties. By contrast, a ferroelectric memory cell may include a capacitor that has a ferroelectric as the dielectric material. Different levels of charge of a ferroelectric capacitor may represent different logic states. Ferroelectric materials have non-linear polarization properties; some details and advantages of a ferroelectric memory cell 105 are discussed below.

Operations such as reading and writing may be performed on memory cells 105 by activating or selecting the appropriate access line 110 and digit line 115. Access lines 110 may also be referred to as word lines 110 and digit lines 115 may also be referred to as bit lines 115. Activating or selecting a word line 110 or a digit line 115 may include applying a voltage to the respective line. Word lines 110 and digit lines 115 are made of conductive materials. For example, word lines 110 and digit lines 115 may be made of metals (such as copper, aluminum, gold, tungsten, etc.), metal alloys, other conductive materials, or the like. According to the example of FIG. 1, each row of memory cells 105 is connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell.

In some architectures, the logic storing device of a cell (e.g., a capacitor) may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105.

Accessing memory cells 105 may be controlled through a row decoder 120 and a column decoder 130. In some examples, a row decoder 120 receives a row address from the memory controller 140 and activates the appropriate word line 110 based on the received row address. Similarly, a column decoder 130 receives a column address from the memory controller 140 and activates the appropriate digit line 115. For example, memory array 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed.

Upon accessing, a memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may be based on biasing, or applying a voltage, to the ferroelectric capacitor. The discharging may induce a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa. The reliability of a sensing operation may be dependent on a sensing window that results from reading the memory cell 105. For instance, a larger sensing window may be associated with fewer bit errors than a smaller sensing window. The sensing window may be determined as the difference between a voltage of a digit line 115 resulting from reading a memory cell 105 when storing a logic 1 and a the voltage of the digit line 115 resulting from reading the memory cell when storing a logic 0. Sense component 125 may include various transistors or amplifiers in order to detect and amplify a difference in the signals, which may be referred to as latching. The detected logic state of memory cell 105 may then be output through column decoder 130 as output 135.

A memory cell 105 may be set, or written, by activating the relevant word line 110 and digit line 115. As discussed above, activating a word line 110 electrically connects the corresponding row of memory cells 105 to their respective digit lines 115. By controlling the relevant digit line 115 while the word line 110 is activated, a memory cell 105 may be written—i.e., a logic value may be stored in the memory cell 105. Column decoder 130 may accept data, for example input 135, to be written to the memory cells 105. A ferroelectric memory cell 105 may be written by applying a voltage across the ferroelectric capacitor. This process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, ferroelectric memory cells 105 may have beneficial properties that may result in improved performance relative to other memory architectures.

For instance, ferroelectric memory cells 105 may retain a stored state for longer periods of time relative to a DRAM memory cell (e.g., days), which may reduce or eliminate the need for refresh operations. Over time however, a ferroelectric memory cell 105 storing a logic state for an extended period (e.g., hours, days, months, etc.) may experience a shifting of ferroelectric domains within an associated ferroelectric capacitor. This imprint may negatively affect subsequent read and write operations from and to the ferroelectric memory cell 105. For instance, writing a logic state to the ferroelectric memory cell 105 that is opposite to a logic state stored for an extended period of time, may result in a "soft write" condition as will be described in more detail below. A soft write may result in a degraded read operation, which may be characterized by a decreased sensing window for the ferroelectric memory cell. In some cases, the extended period of time discussed above may not necessarily be associated with a period of time such as a day, month, or longer, but may instead be associated with the time between storing a logic value and a subsequent point in time at which increased read/write errors may occur or are expected to occur.

Accordingly, memory cells 105 of memory array 100 may be written with different logic states to maintain reliability of the ferroelectric memory cell—e.g., reducing a bit error rate, write errors, etc. In some examples, memory array 100 may periodically write each ferroelectric memory cell 105 of the memory array 100 or of a subsection of the memory array 100 with a value opposite the currently stored value. For instance, the memory array 100 may identify a time period (e.g., a time period that corresponds to a point in time at which the expected sensing window falls below a threshold value after storing an initial value) and may update one or more ferroelectric memory cells 105 of the memory array 100 at a periodic interval spanning the identified period of time. This time period may be determined to be shorter than the extended time period discussed above. In some cases, the time period may be determined based on internal characteristics of the ferroelectric memory cells 105, a temperature of the memory array 100, an age of the ferroelectric memory cells 105, a sensing window resulting from reading the ferroelectric memory cells 105, and the like.

In another example, one or more ferroelectric memory cells 105 that have not been accessed for the time period may be identified and the opposite logic state may be written to those ferroelectric memory cells 105. In another example, which may reduce the load on a processor of the memory array 100, subsections of memory array 100 that include one or more ferroelectric memory cells 105 that have not been accessed for the time period may be identified and rewritten with the opposite logic state to each of the ferroelectric memory cells 105 within the subsection. In yet another example, each ferroelectric memory cell 105 of a subsection of the memory array 100 may be written with the opposite logic state each time the subsection is activated. The memory array 100 may employ an indicator that uses one value to indicate that the logic state stored by the memory cell 105 is the intended logic state (i.e., the logic value that is initially stored and expected to be read by an application) and another value to indicate that the logic state stored by the memory cell 105 is the logic state opposite of the intended logic state.

The memory controller 140 may control the operation (e.g., read, write, re-write, refresh, etc.) of memory cells 105 through the various components, such as row decoder 120, column decoder 130, and sense component 125. Memory controller 140 may generate row and column address signals in order to activate the desired word line 110 and digit line 115. Memory controller 140 may also generate and control various voltage potentials used during the operation of memory array 100. In general, the amplitude, shape, or duration of an applied voltage discussed herein may be adjusted or varied and may be different for the various operations for operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

In some cases, the memory controller 140 may be used to maintain the performance of a ferroelectric memory cell 105. For example, memory controller 140 may write a logic state different than the logic state currently stored by a ferroelectric memory cell 105 after determining a first time period has elapsed. In some examples, the memory controller 140 may determine the ferroelectric memory cell 105 has stored a logic state for the first time period and may write an opposite logic state to the ferroelectric memory cell 105 based on determining that the ferroelectric memory cell 105 has stored a logic state for the first time period. The memory controller 140 may include other components (e.g., a timing component) in determining that the first time period has elapsed. Furthermore, the memory controller 140 may be used to update an indicator stored in a non-volatile latch, the indicator indicating whether a logic state currently stored by the ferroelectric memory cell 105 is the logic state intended to be read or is different than (e.g., opposite) the logic state intended to be read during a read operation.

Figure 2:
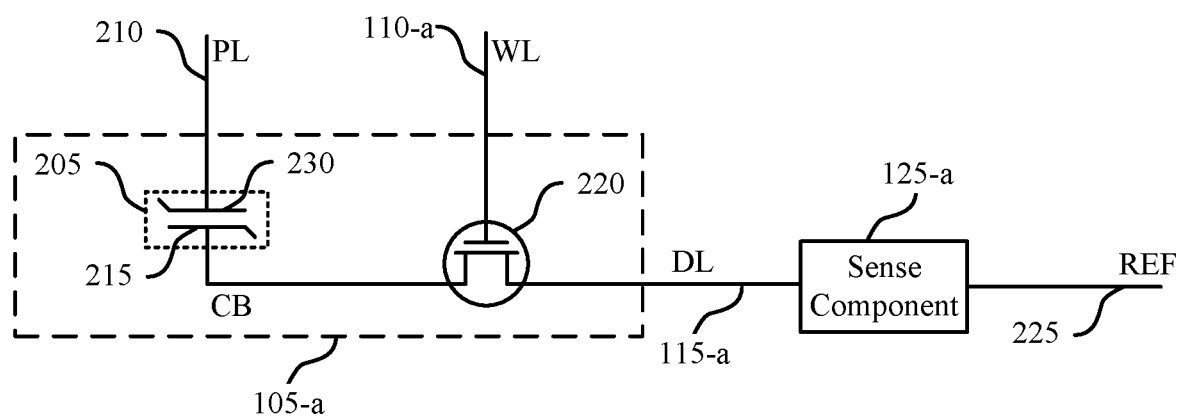
FIG. 2 illustrates an example circuit that includes a memory cell and that supports avoiding imprint of a memory cell in accordance with various embodiments of the present disclosure.

FIG. 2 illustrates an example circuit 200 that supports avoiding imprint of a memory cell in accordance with various embodiments of the present disclosure. Circuit 200 includes a memory cell 105-a, word line 110-a, digit line 115-a, and sense component 125-a, which may be examples of a memory cell 105, word line 110, digit line 115, and sense component 125, respectively, as described with reference to FIG. 1. Memory cell 105-a may include a logic storage component, such as capacitor 205 that has a first plate, cell plate 230, and a second plate, cell bottom 215. Cell plate 230 and cell bottom 215 may be capacitively coupled through a ferroelectric material positioned between them. The orientation of cell plate 230 and cell bottom 215 may be flipped without changing the operation of memory cell 105-a. Circuit 200 also includes selection component 220 and reference line 225. In the example of FIG. 2, cell plate 230 may be accessed via plate line 210 and cell bottom 215 may be accessed via digit line 115-a. As described above, various states may be stored by charging or discharging capacitor 205.

The stored state of capacitor 205 may be read or sensed by operating various elements represented in circuit 200. Capacitor 205 may be in electronic communication with digit line 115-a. For example, capacitor 205 can be isolated from digit line 115-a when selection component 220 is deactivated, and capacitor 205 can be connected to digit line 115-a when selection component 220 is activated. Activating selection component 220 may be referred to as selecting memory cell 105-a. In some cases, selection component 220 is a transistor and its operation is controlled by applying a voltage to the transistor gate, where the voltage magnitude is greater than the threshold magnitude of the transistor. Word line 110-a may activate selection component 220; for example, a voltage applied to word line 110-a is applied to the transistor gate, connecting capacitor 205 with digit line 115-a. In an alternative embodiment, the positions of selection component 220 and capacitor 205 may be switched, such that selection component 220 is connected between plate line 210 and cell plate 230 and such that capacitor 205 is between digit line 115-a and the other terminal of selection component 220. In this embodiment, selection component 220 may remain in electronic communication with digit line 115-a through capacitor 205. This configuration may be associated with alternative timing and biasing for read and write operations.

Due to the ferroelectric material between the plates of capacitor 205, and as discussed in more detail below, capacitor 205 may not discharge upon connection to digit line 115-a. In one scheme, to sense the logic state stored by ferroelectric capacitor 205, word line 110-a may be biased to select memory cell 105-a and a voltage may be applied to plate line 210. In some cases, digit line 115-a is virtually grounded and then isolated from the virtual ground (i.e., "floating") prior to biasing plate line 210 and word line 110-a. Biasing plate line 210 may result in a voltage difference (e.g., plate line 210 voltage minus digit line 115-a voltage) across capacitor 205. The voltage difference may yield a change in the stored charge on capacitor 205, where the magnitude of the change in stored charge may depend on the initial state of capacitor 205—e.g., whether the initial state stored a logic 1 or a logic 0. This may cause a change in the voltage of digit line 115-a based on the charge stored on capacitor 205. Operation of memory cell 105-a by varying the voltage to cell plate 230 may be referred to as "moving cell plate."

The change in voltage of digit line 115-a may depend on its intrinsic capacitance. That is, as charge flows through digit line 115-a, some finite charge may be stored in digit line 115-a and the resulting voltage depends on the intrinsic capacitance. The intrinsic capacitance may depend on physical characteristics, including the dimensions, of digit line 115-a. Digit line 115-a may connect many memory cells 105 so digit line 115-a may have a length that results in a non-negligible capacitance (e.g., on the order of picofarads (pF)). The resulting voltage of digit line 115-a may then be compared to a reference (e.g., a voltage of reference line 225) by sense component 125-a in order to determine the stored logic state in memory cell 105-a. Other sensing processes may be used.

Sense component 125-a may include various transistors or amplifiers to detect and amplify a difference in signals, which may be referred to as latching. Sense component 125-a may include a sense amplifier that receives and compares the voltage of digit line 115-a and reference line 225, which may be a reference voltage. The sense amplifier output may be driven to the higher (e.g., a positive) or lower (e.g., negative or ground) supply voltage based on the comparison. For instance, if digit line 115-a has a higher voltage than reference line 225, then the sense amplifier output may be driven to a positive supply voltage. In some cases, the sense amplifier may additionally drive digit line 115-a to the supply voltage. Sense component 125-a may then latch the output of the sense amplifier and/or the voltage of digit line 115-a, which may be used to determine the stored state in memory cell 105-a, e.g., logic 1. Alternatively, if digit line 115-a has a lower voltage than reference line 225, the sense amplifier output may be driven to a negative or ground voltage. Sense component 125-a may similarly latch the sense amplifier output to determine the stored state in memory cell 105-a, e.g., logic 0. The latched logic state of memory cell 105-a may then be output, for example, through column decoder 130 as output 135 with reference to FIG. 1.

To write memory cell 105-a, a voltage may be applied across capacitor 205. Various methods may be used. In one example, selection component 220 may be activated through word line 110-a in order to electrically connect capacitor 205 to digit line 115-a. A voltage may be applied across capacitor 205 by controlling the voltage of cell plate 230 (through plate line 210) and cell bottom 215 (through digit line 115-a). To write a logic 0, cell plate 230 may be taken high, that is, a positive voltage may be applied to plate line 210, and cell bottom 215 may be taken low, e.g., virtually grounding or applying a negative voltage to digit line 115-a. The opposite process is performed to write a logic 1, where cell plate 230 is taken low and cell bottom 215 is taken high.

In some examples, if memory cell 105-a stores a logic state for an extended period of time—e.g., stores an initial logic state for a period of time without being accessed—the ferroelectric dipoles or domains within capacitor 205 may begin to reorder ("shift"). The shift in ferroelectric domains may result in a failed write operation when the opposite logic state is written to the capacitor 205. This shifting may further result in a failed read operation when sensing the logic state stored by capacitor 205. Accordingly, the logic state stored by memory cell 105-a may be periodically written with the opposite logic state to mitigate the reordering of ferroelectric domains within capacitor 205; process may be referred to as flipping or inverting the bit stored in memory cell 105-a. In the following discussion the terms "flipping" (of "flipped") and "inverting" (or "inverted") may be used interchangeably. In some cases, to write the opposite state, the sense component 125-a may be driven to apply either a high or low voltage to digit line 115-a, a voltage may be concurrently applied to word line 110-a, and the plate line 210 may be conversely driven low or high to apply a voltage across capacitor 205, as discussed above. In some examples, the circuit 200 includes a non-volatile latch to store a value for an indicator that indicates whether the logic state stored by memory cell 105-a has been flipped. In this way, a device (e.g., a controller) may determine whether the logic state sensed from memory cell 105-a is the logic state that was initially stored and intended to be read or if the sensed logic state is the opposite of the initially stored state and that the opposite of the sensed logic value is intended to be read.

Figure 3:
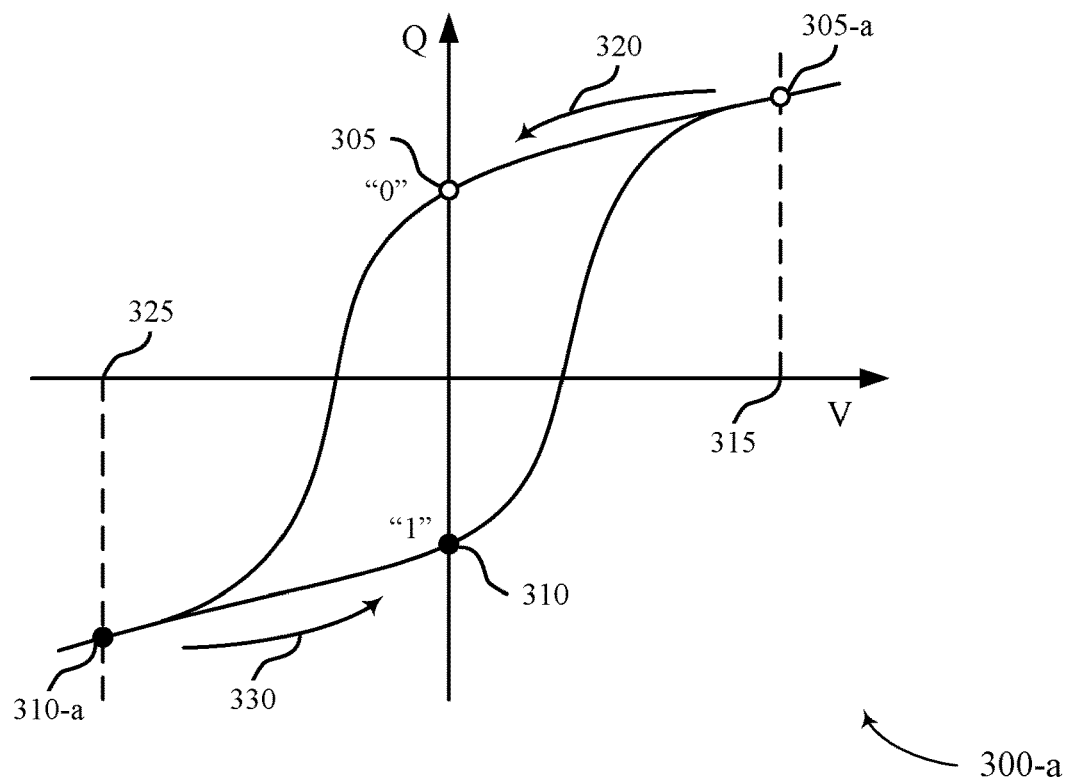
FIG. 3 illustrates example hysteresis plots for a ferroelectric memory cell that is operated in accordance with various embodiments of the present disclosure.
Figure 3:
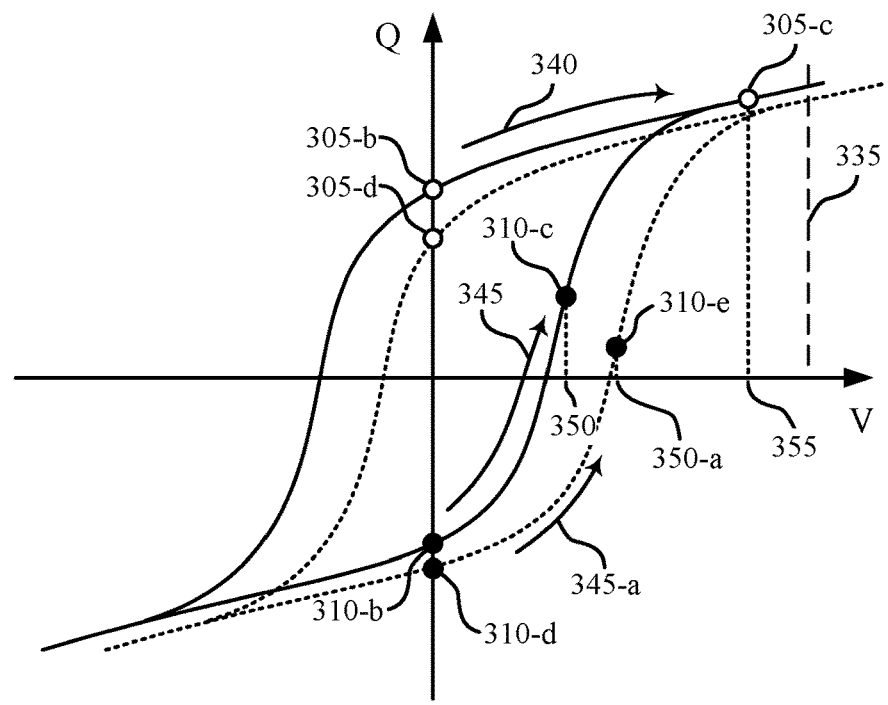

FIG. 3 illustrates examples of non-linear properties with hysteresis curves 300-a and 300-b for a ferroelectric memory cell that is operated in accordance with various embodiments of the present disclosure. Hysteresis curves 300-a and 300-b illustrate an example ferroelectric memory cell writing and reading process, respectively. Hysteresis curves 300 depict the charge, Q, stored on a ferroelectric capacitor (e.g., capacitor 205 of FIG. 2) as a function of a voltage difference, V.

A ferroelectric material is characterized by a spontaneous electric polarization, i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300 may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300 represent a voltage difference across the capacitor and are directional. For example, a positive voltage may be realized by applying a positive voltage to the terminal in question (e.g., a cell plate 230) and maintaining the second terminal (e.g., a cell bottom 215) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300.

As depicted in hysteresis curve 300-a, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage potential. Similarly, charge state 310 is written by applying a net negative voltage 325, which results in charge state 310-a. After removing negative voltage 325, charge state 310-a follows path 330 until it reaches charge state 310 at zero voltage. Charge states 305-a and 310-a may also be referred to as the remnant polarization values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied to the capacitor. In response, the stored charge, Q, changes and the degree of the change depends on the initial charge state—i.e., the final stored charge (Q) may depend on whether charge state 305-b or 310-b was initially stored. For example, hysteresis curve 300-b illustrates two possible stored charge states 305-b and 310-b. Voltage 335 may be applied to a capacitor cell plate—e.g., cell plate 230 with reference to FIG. 2. Although depicted as a positive voltage, voltage 335 may be negative. In response to voltage 335, charge state 305-b may follow path 340. Likewise, if charge state 310-b was initially stored, then it follows path 345. The final position of charge state 305-c and charge state 310-c depend on a number of factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. So a voltage measured at a sense component may not equal voltage 335 and instead may depend on the voltage of the digit line. The position of final charge states 305-c and 310-c on hysteresis curve 300-b may thus depend on the capacitance of the digit line and may be determined through a load-line analysis—i.e., charge states 305-c and 310-c may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—i.e., (voltage 335-voltage 350) or (voltage 335-voltage 355). A reference voltage may be generated so that its magnitude is between the two possible digit line voltages in order to determine the stored logic state—i.e., to determine whether the digit line voltage is higher or lower than the reference voltage. For example, the reference voltage may be an average of the two quantities, (voltage 335-voltage 350) and (voltage 335-voltage 355). Upon comparison by the sense component, the sensed digit line voltage may be determined to be higher or lower than the reference voltage, and the stored logic value of the ferroelectric memory cell (i.e., a logic 0 or 1) may be determined.

As discussed above, reading a memory cell that does not use a ferroelectric capacitor may degrade or destroy the stored logic state. A ferroelectric memory cell, however, may maintain the initial logic state after a read operation. For example, if charge state 310-b is stored, the charge state may follow path 345 to charge state 310-c during a read operation and, after removing voltage 350. In some cases, reading a ferroelectric memory cell may disturb the logic state of the cell. For instance, charge state 310-b may no longer be stored after reading the ferroelectric memory cell. Therefore, a write-back procedure may be performed. In such cases, the write-back procedure may involve application of a voltage to restore the charge of the cell to its initial charge state 310-b.

A ferroelectric capacitor operating with an imprint condition (i.e., an imprinted cell) may follow an alternative path 345-a (e.g., if charge state 310-b is stored for an extended period of time). The alternative path 345-a may be associated with a charge state 310-e, which is less than charge state 310-c, and a voltage 350-a across the capacitor, which is greater than 350. Therefore, the resulting voltage of the digit line (voltage 335-voltage 350-a) may be smaller than the voltage of the digit line 115 associated with voltage 350. Additionally, the remnant polarization (e.g., as measured between charge state 305-d—and charge state 310-d) may decrease with fatigue. As a result, the difference between the resulting voltage of the digit line, (voltage 335-voltage 350-a) and (voltage 335-voltage 355), may also be smaller, which may yield a smaller sensing window and increased number of read errors. The change in the path followed by a ferroelectric capacitor may increase over time and may be referred to as "drift." Furthermore, writing an opposite logic state to an imprinted ferroelectric capacitor may result in a soft write. A soft write may be associated with a lower charge state being stored by the ferroelectric capacitor, such as charge state 305-d, and as a result the ferroelectric capacitor may share a smaller amount of charge with an associated digit line. Accordingly, the sensing window of a subsequent read operation may also be reduced.

In some examples, a logic state opposite of the logic state currently being stored by the ferroelectric capacitor may be written to the ferroelectric capacitor at configured intervals. This may minimize the amount of drift that occurs between storing a logic value by a ferroelectric capacitor and reading the logic state stored by the ferroelectric capacitor. In some examples, if the ferroelectric capacitor stores a first charge state, such as charge state 310-b, for a determined period of time without being accessed, the opposite charge state (e.g., charge state 305-b) may be written to the ferroelectric capacitor. Over time, if the ferroelectric capacitor is still not accessed while charge state 305-b is stored, the hysteresis curve may shift in the opposite direction. The shift in the opposite direction may similarly result in soft write conditions where a lower magnitude charge state than charge state 310-b may be stored by the ferroelectric cell in subsequent write operations. As a result, the sensing window may be reduced. Accordingly, after a second period of time, the initial charge state 310-b may be written back to and stored by the ferroelectric capacitor for another period of time. In this way, the magnitude of drift may be decreased and the effects of imprint may be mitigated.

Figure 4:
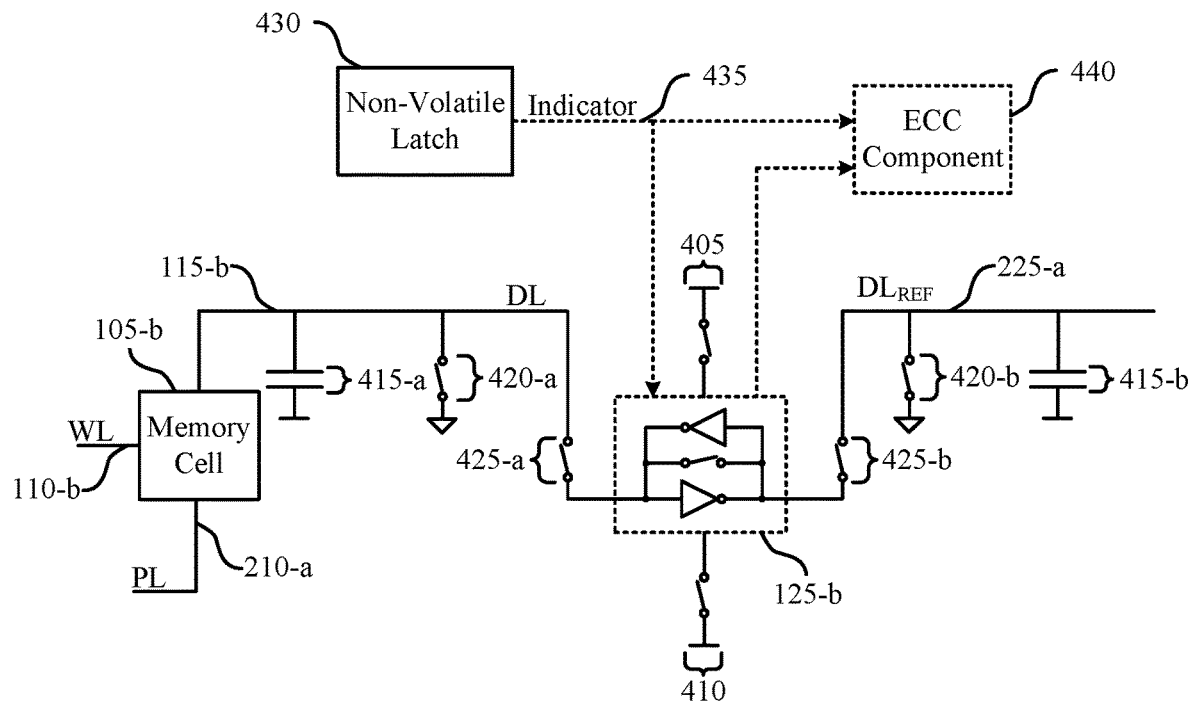
FIG. 4 illustrates an example circuit that supports avoiding imprint of a memory cell in accordance with various embodiments of the present disclosure.

FIG. 4 illustrates an example circuit 400 that supports avoiding imprint of a memory cell in accordance with various embodiments of the present disclosure. Circuit 400 includes memory cell 105-b, word line 110-b (which may also be referred to as an access line), digit line 115-b, and sense component 125-b, which may be examples of a memory cell 105, word line 110, digit line 115, and sense component 125, respectively, described with reference to FIGS. 1 and 2. Memory cell 105 may include a ferroelectric capacitor that operates with characteristics as described with reference to FIG. 3. Circuit 400 also includes plate line 210-a and reference line 225-a, which may be examples of plate line 210 and reference line 225, respectively, described with reference to FIG. 2. Circuit 400 also includes voltage source 405, voltage source 410, equalization switches 420-a and 420-b, and isolation components 425-a and 425-b. Equalization switches 420 and isolation components 425 may also be generally referred to as switching components. Circuit 400 may also include non-volatile latch 430, indicator line 435, and ECC component 440.

Digit line 115-b and reference line 225-a may have intrinsic capacitances 415-a and 415-b, respectively. Intrinsic capacitances 415-a and 415-b may not be electrical devices—i.e., they may not be two-terminal capacitors. Instead, intrinsic capacitances 415-a and 415-b may represent capacitance that resulting from physical characteristics, including the dimensions, of digit line 115-b and reference line 225-a. In some cases, reference line 225-a is an unused or inactive digit line. In some examples, digit line 115-b and reference line 225-a may be connected to or separated from virtual ground through equalization switches 420-a and 420-b. A virtual ground may act as a common reference for circuit 400 and may also be referred to as ground or 0V, although, the virtual ground may float to a voltage that is different than (e.g., greater or less than) zero volts when compared with an earth ground.

In some examples, control signals (e.g., a linear equalization signal) may be used to activate or deactivate equalization switches 420-a or 420-b by increasing or decreasing a linear equalization voltage applied to the switching component, respectively. In some cases, equalization switch 420-a may be used to prevent the voltage of digit line 115-b from floating while digit line 115-b is not being used.

Equalization switches 420-a and 420-b and isolation component 425-a and 425-b may be implemented as transistors (e.g., field effect transistors (FETs)).

A voltage may be applied to reference line 225-a to provide a reference for comparing with the voltage of digit line 115-b. The voltage of reference line 225-a may be used by sense component 125-b as a reference for comparison against the voltage of digit line 115-b. As depicted, memory cell 105-b is in electronic communication with digit line 115-b. Memory cell 105-b may include a selection component in electronic communication with a ferroelectric capacitor via word line 110-b, as described with reference to FIG. 2. The selection component may be activated by applying a voltage to word line 110-b and may be used to provide a conductive path between the ferroelectric capacitor and the digit line 115-b. In one example, memory cell 105-b may be selected, using the selection component, for a read operation to determine a state stored by the ferroelectric capacitor.

Plate line 210-a may also be in electronic communication with the ferroelectric capacitor. In some cases, a plate of the ferroelectric capacitor may be biased via plate line 210-a (e.g., for a read operation). Applying a non-zero voltage across the capacitor in combination with applying a voltage to word line 110-b may result in the ferroelectric capacitor charging digit line 115-b. That is, upon accessing memory cell 105-b, the ferroelectric capacitor may share charge with digit line 115-b via intrinsic capacitance 415-a. In some examples, the digit line 115-b may be driven to a ground reference or a supply voltage, and a voltage may be applied at plate line 210-a to apply a voltage across the ferroelectric capacitor. For example, the voltage applied to plate line 210-a may be ramped from a first to a second voltage. In some examples, a constant voltage may be applied to plate line 210-a and the voltage of digit line 115-b may be driven to a virtual ground or a supply voltage to apply a voltage across the ferroelectric capacitor.

Isolation component 425-a may be in electronic communication with sense component 125-b and digit line 115-b, and isolation component 425-b may be in electronic communication with sense component 125-b and reference line 225-a. Isolation components 425-a and 425-b may be used to isolate digit line 115-b and reference line 225-a from sense component 125-b. Sense component 125-b may be used to determine the stored state of memory cell 105-b. In some cases, sense component 125-b is or includes a sense amplifier. Sense component 125-b may be operated by voltage source 405 and voltage source 410. In some examples, voltage source 405 is a positive supply voltage, while voltage source 410 is a negative supply voltage or a virtual ground.

Sense component 125-b may be used to determine a logic value of the memory cell 105-b based on the voltage of digit line 115-b and the voltage of the reference line 225-a. In some examples, sense component 125-b is activated or "fired"—e.g., by a controller—to trigger a comparison between the voltage of digit line 115-b and the voltage of reference line 225-a. Sense component 125-b may latch the output of a sense amplifier to the voltage provided by either voltage source 405 or voltage source 410. For instance, if the voltage of the digit line 115-b is greater than the voltage of the reference line 225-a, then sense component 125-b may latch the output of the sense amplifier at a positive voltage supplied from voltage source 405. Sense component 125-b may also be used to write a logic value to memory cell 105-b. For instance, during a write operation, sense component 125-b may be triggered to apply a voltage that is greater than a voltage applied at plate line 210-a to write a logic state 1 to memory cell 105-b. In some examples, the voltage applied by sense component 125-b is dependent on voltage source 405 and 410. For instance, voltage source 405 may provide the voltage that is greater than the voltage applied at plate line 210-a.

Non-volatile latch 430 may be used to store a value for an indicator that indicates whether the logic state sensed by sense component 125-b is the logic state that is intended to be read from memory cell 105-b—e.g., the logic state stored at memory cell 105-b by a user application. In some examples, a value of the indicator (e.g., 1) provided to sense component 125-b may cause the sense component 125-b to output the logic state opposite to the logic state sensed at digit line 115-b. In some examples, non-volatile latch 430 may be implemented by an unused ferroelectric memory cell—e.g., a ferroelectric memory cell that is not used by user applications to store memory. Non-volatile latch 430 may provide the indicator to sense component 125-b and/or ECC component 440 via indicator line 435. If non-volatile latch 430 is implemented as an unused ferroelectric memory cell in the memory array, indicator line 435 may be implemented using an associated digit line.

In some examples, a memory array simultaneously accesses a set of memory cells, or a "page" that includes memory cell 105-b. Each memory cell of the page may be associated with a corresponding non-volatile latch, such as non-volatile latch 430. In some cases, additional logic may be implemented that receives indicators, including the indicator stored in non-volatile latch 430, from each of the memory cells in the page. The additional logic may be used to determine a value that is shared by a majority of the indicators. The identified value may be input to the sense components, including sense component 125-b, corresponding to the memory cells in the page, and the sense components may output a logic state accordingly. For instance, if a majority of the indicators share the value 1, this value may be input to the corresponding sense components, and the sense components may output the opposite of the sensed logic states. In some cases, the page itself may be associated with a single corresponding non-volatile latch 430, and the value of the non-volatile latch may be provided to the sense components.

ECC component 440 may be used to identify a codeword derived from reading a page that includes memory cell 105-b. In some examples, ECC component 440 may implement ECC logic to determine an intended state of the memory cells in the page in place of providing indicators to the corresponding sense components. In some cases, the indicators for each of the memory cells included in the page may be provided to ECC component 440 via indicator lines, such as indicator line 435. ECC component 440 may also be in electronic communication with multiple sense components, including sense component 125-b, that output a voltage corresponding to a logic state sensed when reading the corresponding memory cells. ECC component 440 may use the output voltages received from sense components in addition to the indicators to determine the intended logic state of each of the memory cells in the page. For example, ECC component 440 may be used to identify a codeword derived from reading the page including memory cell 105-b. ECC component 440 may use the value of the identified codeword to determine whether the intended logic states of the memory cells are the same or different than the logic states sensed and output by the corresponding sense components, as will be described in more detail below. In some examples, ECC component 440 may be implemented using a plurality of memory cells that store a codeword used to validate data stored by a plurality of memory cells (e.g., a page). In other examples, ECC component 440 may be independent of the memory array and may be implemented as a standalone component.

In some examples, a controller may be used to operate circuit 400 to maintain the performance of memory cell 105-*b*. For instance, the controller may be used to trigger sense component 125-*b* to perform a sensing operation or to apply a voltage to digit line 115-*b* and/or reference line 225-*a*. The controller may also be used to activate/deactivate equalization switches 420 and isolation components 425 and to select memory cell 105-*b* via word line 110-*b*. In some examples, the controller may be used to access memory cell 105-*b* using word line 110-*b* and to read/write to memory cell 105-*b* using plate line 210-*a* and digit line 115-*b*. The controller may include one or more components (e.g., a timing component) to aid in determining that the memory cell 105-*b* or that a ferroelectric memory cell within a subsection of a memory array has stored a logic state for a time period. After identifying the time period has elapsed, the controller may use the word line 110-*b*, plate line 210-*a*, digit line 115-*b*, and/or sense component 125-*b* to write the opposite logic state to memory cell 105-*a*.

The controller may determine a time period used to trigger the writing of the opposite logic state based on a model of the memory cell 105-*b*. For instance, the controller may determine the time period based on characteristics of memory cell 105-*b*, an expected temperature, life of operation, and resulting sensing windows. In some examples, the controller may periodically update the memory array based on the determined time period. In some cases, the controller may dynamically modify the time period based on a temperature measured during operation or a number of access operations performed on the memory cell, or both. In other cases, the controller may trigger the writing of the opposite logic state based on alternative criteria or supplemental criteria to the time period. For instance, the controller may trigger writing the opposite logic state in response to an event, such as a transitioning of a device comprising the memory cell 105-*b* to an full-power mode, the powering-up of the device, a number of errors being detected, receipt of an input from a user of the device, or the like.

Figure 5:
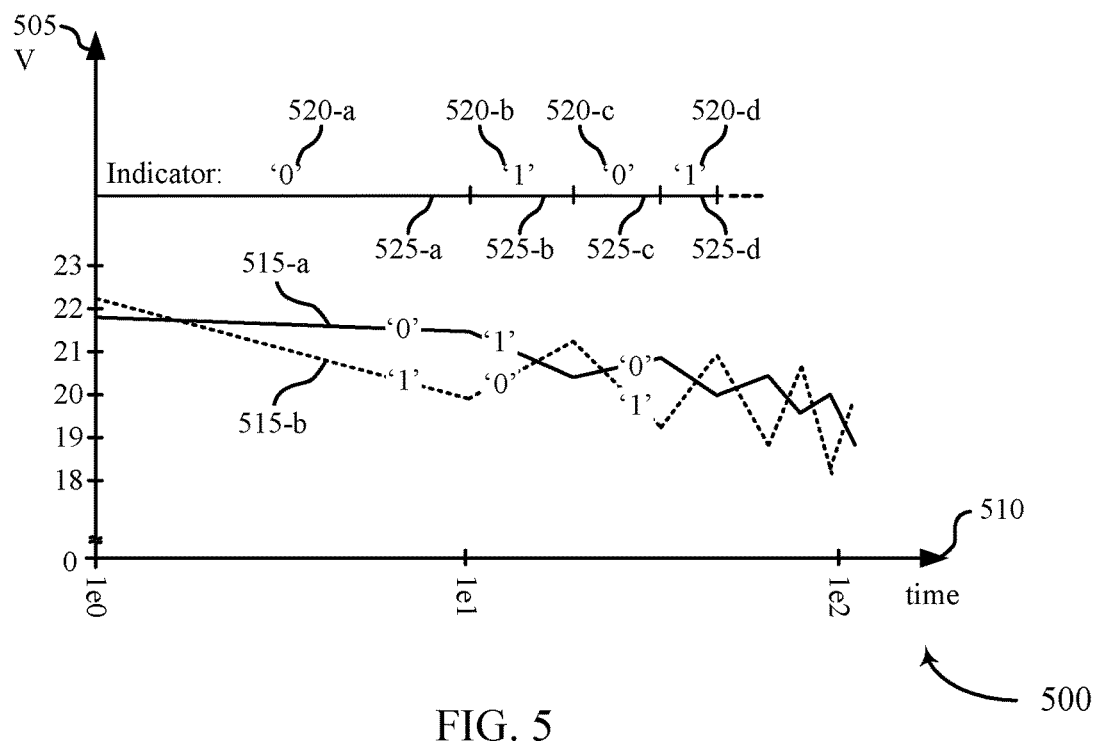
FIG. 5 shows an example diagram illustrating operation of the example circuit in accordance with various embodiments of the present disclosure.

FIG. 5 shows an example diagram 500 illustrating operation of the example circuit in accordance with various embodiments of the present disclosure. Timing diagram 500-*a* depicts voltage on axis 505 and time on axis 510. Thus, the sensing voltage resulting from reading a memory cell, such as memory cell 105-*b* may be represented as a logarithmic function of time.

As discussed with reference to FIG. 4, a logic state different than a logic state currently stored by a memory cell may be written to a memory cell at certain points in time (e.g., at configured intervals the bit stored by a memory cell may be flipped). In addition, an indicator may be provided to indicate whether the logic state currently stored by a memory cell 105-*b* is an intended logic state. In the example of FIG. 5, a memory cell, such as memory cell 105-*b*, may store one of two logic states, logic 0 or logic 1. Sensing window voltage 515-*a* represents the sensing window voltage resulting from reading a memory cell storing a logic 0, and sensing window voltage 515-*b* represents the sensing window voltage 515 resulting from reading a memory cell storing a logic 1. As depicted, the decrease in sensing window voltage 515-*b* over time may be markedly larger than the decrease in sensing window voltage 515-*a*. Accordingly, the logic state stored by the memory cell 105-*b* may be flipped periodically to counter the decrease in the sensing window voltage that occurs as a result of one of the two logic states. In some cases, the value of the indicator 520-*a* may be initially set as 0, and may be used to convey that the logic state currently stored by memory cell 105-*b* is the intended logic state.

At the start of first time period 525-*a*, logic 0 may be written to and stored by memory cell 105-*b*, and the sensing window that is expected to result from a read operation of the memory cell 105-*b* may be represented over first time period 525-*a* by sensing window voltage 515-*a*. Concurrently, the indicator 520-*a* may be initialized with the value 0. As shown, the sensing window voltage 515-*a* resulting from reading memory cell 105-*b* may decrease over first time period 525-*a*. If memory cell 105-*b* is read during first time period 525-*a*, the sense component 125-*b* may sense that memory cell 105-*b* is storing a logic 0. The sense component 125-*b* may additionally take indicator 520-*a* into account when sensing the stored logic value and may output that the intended logic state stored of memory cell 105-*b* is indeed a logic 0 based on the value of indicator 520-*a* being 0.

At the start of subsequent second time period 525-*b*, the opposite logic state, logic 1, may be written to memory cell 105-*b*. In some cases, a controller may be used to determine whether first time period 525-*a* has elapsed prior to writing the opposite logic state. If memory cell 105-*b* is read during second time period 525-*b*, the sense component 125-*b* may sense that memory cell 105-*b* is storing a logic 1. As above, the sense component 125-*b* may additionally take indicator 520-*b* into account when sensing the stored logic value. However, in this case, sense component 125-*b* may output that the intended logic state stored by memory cell 105-*b* is actually a logic 0 in place of the sensed logic 1 based on the value of indicator 520-*b* being 1. Table 1, which is provided below, illustrates an example logic table for determining whether the logic state sensed by sense component 125-*b* is the intended output state or the opposite of the intended output state based on the indicated value.

TABLE 1

| Sensed Logic State | Indicator Value | Intended Logic State |
| --- | --- | --- |
| 0 | 0 | 0 |
| 1 | 0 | 1 |
| 0 | 1 | 1 |
| 1 | 1 | 0 |

Aspects of the above discussion may also be extended to multiple memory cells (e.g., a page) that includes memory cell 105-*b*. For example, at the beginning of first time period 525-*a*, either a logic 0 or a logic 1 may be written to each of the memory cells in a page. Each memory cell of the page may be associated with a corresponding non-volatile latch, such as a non-volatile latch 430, and a corresponding sense component. Concurrently, each non-volatile latch may be set with a value of 0 to indicate that the logic state currently stored by the memory cells is the intended logic state. After first time period 525-*a* has elapsed, each memory cell of the page may be written with an opposite logic state than the initially stored logic state. Accordingly, each non-volatile latch may be updated with a value of 1 to indicate that the intended logic is different than (e.g., opposite) the currently stored logic state. Additionally or alternatively, a single non-volatile latch 430 may be used to indicate whether the page itself has been written with opposite logic states.

In some examples, each of the non-volatile latches may be coupled with a corresponding sense component and/or memory cell. And if the page is read during second time period 525-b, each of the sense components may output an intended logic in place of the currently stored logic state based on indicators received from the corresponding non-volatile latches. In other examples, each of the indicators is first input to additional logic which may be used to determine a value that is shared by a majority of the indicators. The determined value may then be input to each of the sense components and used for determining the intended logic states for the page. In this way, a small number of corrupted indicators may be prevented from corrupting an entire page. For example, the additional logic may identify that the majority of received indicators have a value of 1, and the identified value 1 may be input to the sense components. Accordingly, the sense components that sense a logic 0 may instead output a logic 1, whereas the sense components that sense a logic 1 may output a logic 0.

In an alternative example, ECC logic may be used to determine whether the logic states received from a page are the intended logic states or the opposite of the intended logic states. For example, ECC component 440 may validate logic states received from a number of sense components and may invert or pass the received logic state based on the value of an indicator received from non-volatile latch 430. In another example, ECC component 440 may generate and store two codewords, a first codeword corresponding to the stored logic states being the same as the intended logic state and a second codeword corresponding to the stored logic state being different (e.g., opposite) than the stored logic states. ECC component 440 may receive indicators, including indicator 520-a, associated with each of the memory cells in the page, and may use the received indicators in identifying a codeword derived from reading the page. For instance, the indicators received by ECC component 440 may be used to select the first or the second codeword for comparison with a codeword derived from the logic states received from sense components. In some cases, additional logic may be used to identify a value that is shared by a majority of the received indicators, and the identified value may be used by the ECC component 440 to select one of the codewords. For instance, if the majority of indicators share a value of 1, the ECC component 440 may select the second codeword and determine the received logic states are opposite the logic states that are intended to be read.

In some examples, ECC component 440 may be used independently of the indicators and non-volatile latches. For example, ECC component 440 may compare the first codeword and the second codeword to a codeword derived from the logic states received from the page to determine the intended logic states based on which codeword matches the derived codeword. In other examples, ECC component 440 may use a codeword that has been selected to be symmetric to flipping the logic states of the memory cells in the page. That is, ECC component 440 may select codewords so that a codeword derived from a page that has been flipped and a codeword derived from the page not being flipped are the same.

Once a page has been flipped, one or more memory cells may be written based on the value of non-volatile latch 430. For instance, if an application requests storage of a logic state (e.g., logic state 1) in one or more memory cells (e.g., a word in the page) included in the flipped page, then the opposite logic state (e.g., logic state 0) may be written to the memory cell. In this way, the logic states stored throughout the page may consistently be flipped. In one example for the flipped page, the memory controller may provide the received logic state to sense component 125, and sense component 125 may flip the logic state when writing to memory cell 105-b based on a value of the indicator provided by non-volatile latch 430. In another example for the flipped page, ECC component 440 may flip the received logic states—e.g., based on the value of non-volatile latch 430—and may pass the flipped logic states to the associated sensing components, which may then write the flipped logic states to the corresponding memory cells.

In some examples, first time period 525-a and second time period 525-b are of different lengths, and the process of writing different logic states may be repeated over a periodic cycle. Accordingly, at the beginning of third time period 525-c the initial logic state, logic 0, may be written back to memory cell 105-b and the value of indicator 520-c may be returned to 0. In some cases, the length of the time periods 525 may be based on known or modelled characteristics of memory cells included in the memory array. For instance, the length of the time periods 525 may also be based on environmental and operational factors for all or a part of a memory array including: temperature, age, average delay between access operations, a resulting sensing window, or any combination thereof. In some examples, the length of first time period 525-a and second time period 525-b may be different.

In some examples, the length of the time periods 525 may be dynamically updated based on observed environmental or operational factors. For instance, the temperature of the memory array or a subsection of the array may be measured and a length of the time periods 525 may be modified (e.g., increase or decrease) based on the measured temperature. In some examples, a number of access operations performed on the ferroelectric memory cell may be counted and the length of the time periods 525 may be modified based on the monitored number of access operations. In some cases, a combination of the measured temperature and monitored number of access operations may be used to modify the length of the time periods 525.

Other factors may be taken into account in determining whether to write the opposite state to a memory cell. For instance, writing the opposite logic state to memory cell 105-b may be based on determining that memory cell 105-b has stored the first logic state for first time period 525-a without being accessed. In yet another example, writing the opposite logic state to memory cell 105-b may be based on identifying that a subsection of the memory array including memory cell 105-b has not been accessed for the first time period 525-a.

In some cases, writing the opposite logic state to memory cell 105-b may be independent of a time period 525 and may instead be based on the occurrence of an event. For instance, the opposite logic state may be written to memory cell 105-b in response to determining that a number of read/write errors exceeds a threshold value. In some examples, the opposite logic state may be written in response to determining that that a device including memory cell 105-b has entered an activated state from a low-power or powered down state. In some cases, the opposite logic states may be written to each memory cell of the device based on identifying that the subsection has entered an activated state. Additionally or alternatively, the opposite logic state may be written based on receiving a command from a user to write the opposite logic state regardless of how long memory cell 105-b has stored a logic state. Furthermore, although memory cell 105-*b* is discussed as storing one of two logic states; in some examples, memory cell 105-*b* may store more than two logic states.

Figure 6A:
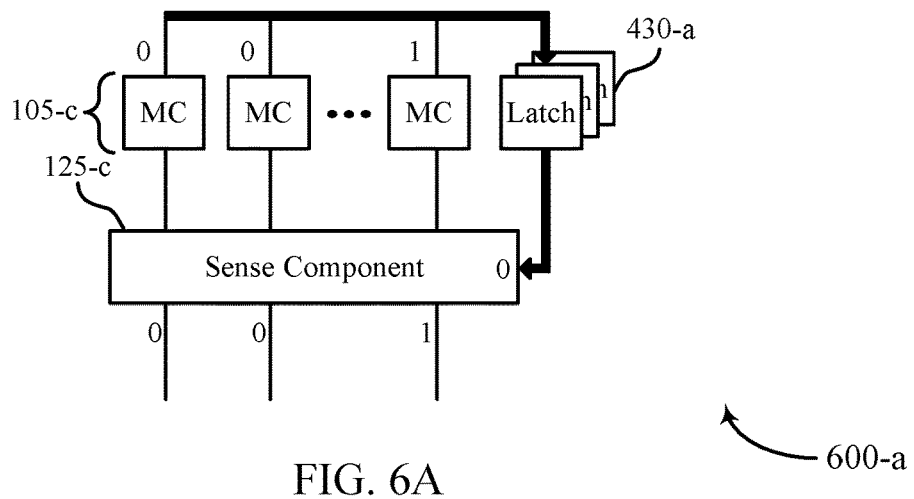
FIG. 6A through 6C shows an example subsection of a memory array that operates in accordance with various embodiments of the present disclosure.

FIG. 6A shows an example subsection 600-*a* of a memory array that operates in accordance with various embodiments of the present disclosure. Subsection 600-*a* includes memory cells 105-*c* and sense component 125-*c*, which may be an example of a memory cell 105 and a sense component, as described with reference to FIGS. 1, 2, and 4, and non-volatile latches 430-*a*, which may be an example of non-volatile latch 430 as described with reference to FIG. 4. In some examples, aspects of the circuit 400, as described with reference to FIG. 4, may be included in subsection 600-*a*.

Memory cells 105-*c* may each be associated with a latch and may store a logic state. In the example of FIG. 6A, memory cells 105-*c* may store the logic states $\{0, 0, \ldots, 1\}$. Non-volatile latches 430-*a* may each correspond to a respective memory cell and may store a value indicating whether a logic state stored by the respective memory cell is the intended logic state. In some examples, a single value is used to indicate the intended logic state for the group of memory cells 105-*c*. For instance, if the majority of the non-volatile latches 430-*a* store a value $\{0\}$, then a single output of the latch may also be zero. In the example of FIG. 6A, each latch may store a value $\{0\}$. During a read operation, sense component 125-*c* may sense memory cells 105-*c*, and based on the latch providing the $\{0\}$ value may determine that the intended logic states of memory cells 105-*c* is the same as the current logic states (e.g., $\{0, 0, \ldots, 1\}$). In other examples, a single non-volatile latch 430-*a* stores a single value used to indicate whether a page containing the memory cell 105-*c* has been written with an intended or inverted logic state. This value may similarly be provided to sense component 125-*c*.

Figure 6B:
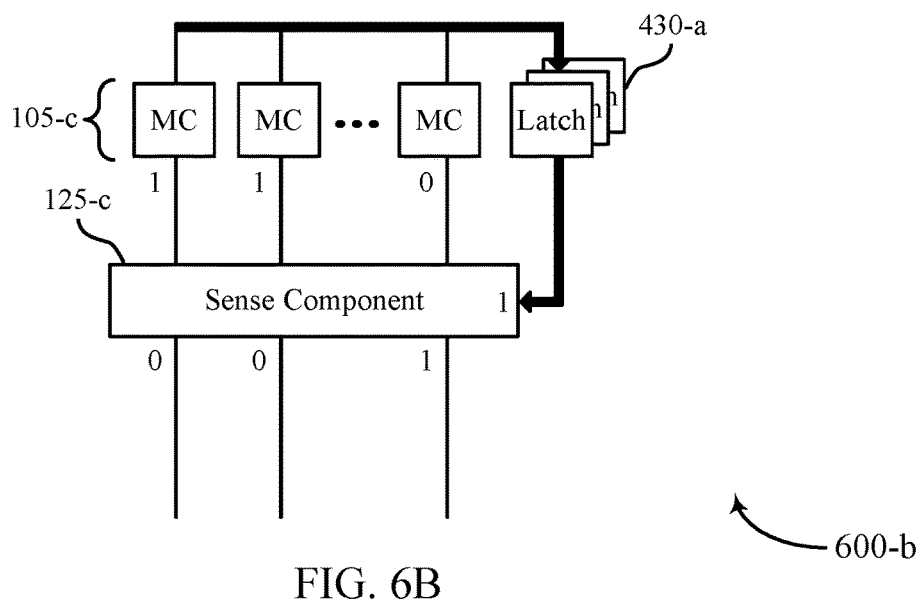

FIG. 6B shows an example subsection 600-*b* of a memory array that operates in accordance with various embodiments of the present disclosure. Subsection 600-*b* includes sense component 125-*c*, in addition to memory cells 105-*c* and non-volatile latches 430-*a*. Sense component 125-*c* may be an example of a sense component 125 as described with reference to FIGS. 1, 2, and 4. In some examples, aspects of the circuit 400, as described with reference to FIG. 4, may be included in subsection 600-*b*.

In the example of FIG. 6B, the logic state stored by each of memory cells 105-*c* may be flipped with respect to an originally stored state. Accordingly, memory cells 105-*c* may store the logic states $\{1, 1, \ldots, 0\}$. Additionally, the value stored by each of the non-volatile latches 430-*a* may also be flipped, and each latch or a majority of the latches may store a $\{1\}$. The value of the majority of non-volatile latches 430-*a* may then be provided to sense component 125-*c*. During a read operation, sense component 125-*c* may sense memory cells 105-*c*, and based on the latch providing the $\{1\}$ value may determine that the intended logic states of memory cells 105-*c* is the opposite as the current logic states (e.g., $\{0, 0, \ldots, 1\}$). In this way, the logic states originally stored in FIG. 6A may be read from sense component 125-*c*. In some examples, each non-volatile latch 430-*a* may be associated with an individual sense component, and the value provided by each latch may be used by the sense component to determine whether to invert a logic state received from a memory cell. In other examples, a single non-volatile latch 430-*a* stores a single value used to indicate whether a page containing the memory cell 105-*c* has been written with an intended or inverted logic state. This value may similarly be provided to sense component 125-*c*.

Figure 6C:
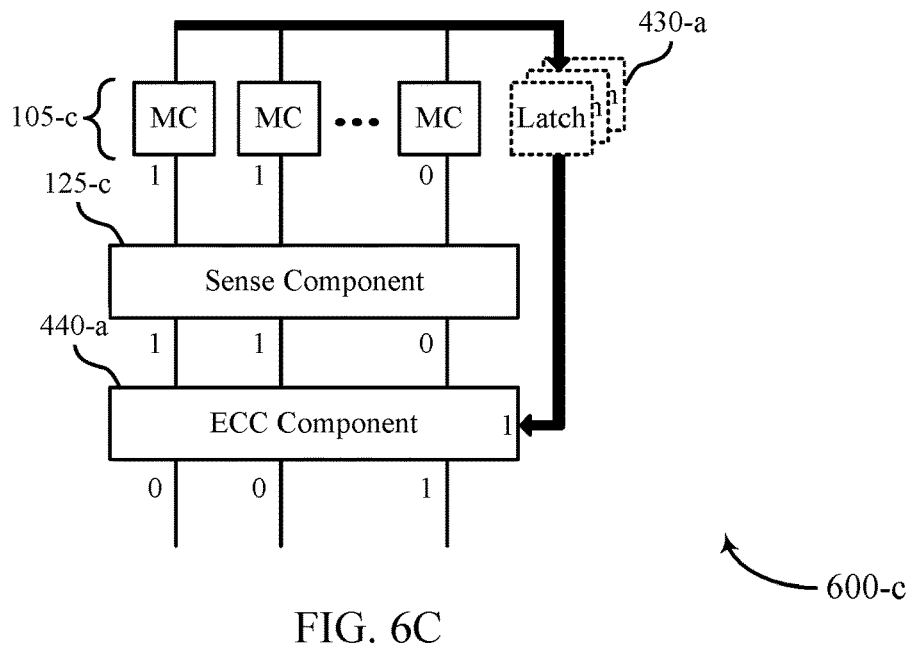

FIG. 6C shows an example subsection 600-*c* of a memory array that operates in accordance with various embodiments of the present disclosure. Subsection 600-*b* includes sense component 125-*c*, in addition to memory cells 105-*c* and non-volatile latches 430-*a*. Subsection 600-*c* also includes ECC component 440-*a*, which may be an example of ECC component 440 as described with reference to FIG. 4. Subsection 600-*c* may depict an alternative technique for reading memory cells 105-*c* with respect to the technique discussed with reference to FIG. 6B. In some examples, aspects of the circuit 400, as described with reference to FIG. 4, may be included in subsection 600-*c*.

In the example of FIG. 6C, the logic state stored by each of memory cells 105-*c* may be flipped with respect to the logic states originally stored in FIG. 6A $\{0, 0, \ldots, 1\}$. Accordingly, memory cells 105-*c* may store the logic states $\{1, 1, \ldots, 0\}$. Additionally, the value stored by each of the non-volatile latches 430-*a* may also be flipped, and each latch or a majority of the latches may store a $\{1\}$. However, in FIG. 6C the value(s) derived from non-volatile latches 430-*a* may not be provided to sense component 125-*c*, but instead may be provided to ECC component 440-*a*. In this way sense component 125-*c* may sense the logic state currently stored by memory cells 105-*c* without considering whether to invert the sensed logic state—e.g., sense component 125-*c* may output the flipped logic states $\{1, 1, \ldots, 0\}$. The output of sense component 125-*c* may be passed to ECC component 440-*a*. ECC component 440-*a* may use the received output to determine a codeword, which may be used to determine whether the data received from memory cells 105-*c* is valid. ECC component 440-*a* may then use the value provided by non-volatile latches 430-*a* to determine whether the logic state stored by memory cells 105-*c* is the intended logic state. In the example of FIG. 6C, ECC component 440-*a* determines that the logic states output by sense component 125-*c* are valid by deriving a codeword matching a stored codeword. Then ECC component 440-*a* inverts the logic states based on determining the value received from non-volatile latches 430-*a* is a $\{1\}$, and accordingly outputs the originally stored/intended logic states $\{0, 0, \ldots, 1\}$. In other examples, a single non-volatile latch 430-*a* stores a single value used to indicate whether a page containing the memory cell 105-*c* has been written with an intended or inverted logic state. This value may similarly be provided to ECC component 440-*a*.

In some examples, subsection 600-*c* does not use non-volatile latches 430-*a*. In such an example, ECC component 440-*a* may store two codewords based on the data stored in memory cells 105-*c*—e.g., a codeword derived for the originally stored logic states (e.g., $\{0, 0, \ldots, 1\}$)—and a codeword derived for the opposite logic states of the originally stored logic states (e.g., $\{1, 1, \ldots, 0\}$). ECC component 440-*a* may then check a codeword derived from an output of sense component 125-*c* with both codewords to determine whether the data stored by memory cells 105-*c* is valid and to determine whether the output logic state is valid. That is, if the codeword associated with the opposite logic states is used to validate the data currently stored by memory cells 105-*c*, ECC component 440-*a* may determine that the originally stored/intended logic states $\{0, 0, \ldots, 1\}$) of memory cells 105-*c* is opposite the currently stored logic states $\{1, 1, \ldots, 0\}$). In other examples, ECC component 440-*a* may determine a codeword for the data stored by memory cells 105-*c* that is symmetric for an intended logic state and for the opposite of the intended logic state.

In some examples, ECC component 440-*a* is implemented as a part of a page including memory cells 105-*c*. That is, ECC bits may be stored in certain memory cells 105-c and are read during a sensing operation of the page. The stored ECC bits may be used to determine whether the data stored by the page is valid or corrupted. In other examples, ECC component 440-a is implemented separate from the memory cells 105-c. That is, ECC bits for a page may be stored in a different section of the memory array and may be used to determine whether the data read from the page is valid or corrupted after reading the logic states of memory cells 105-c.

Figure 7:
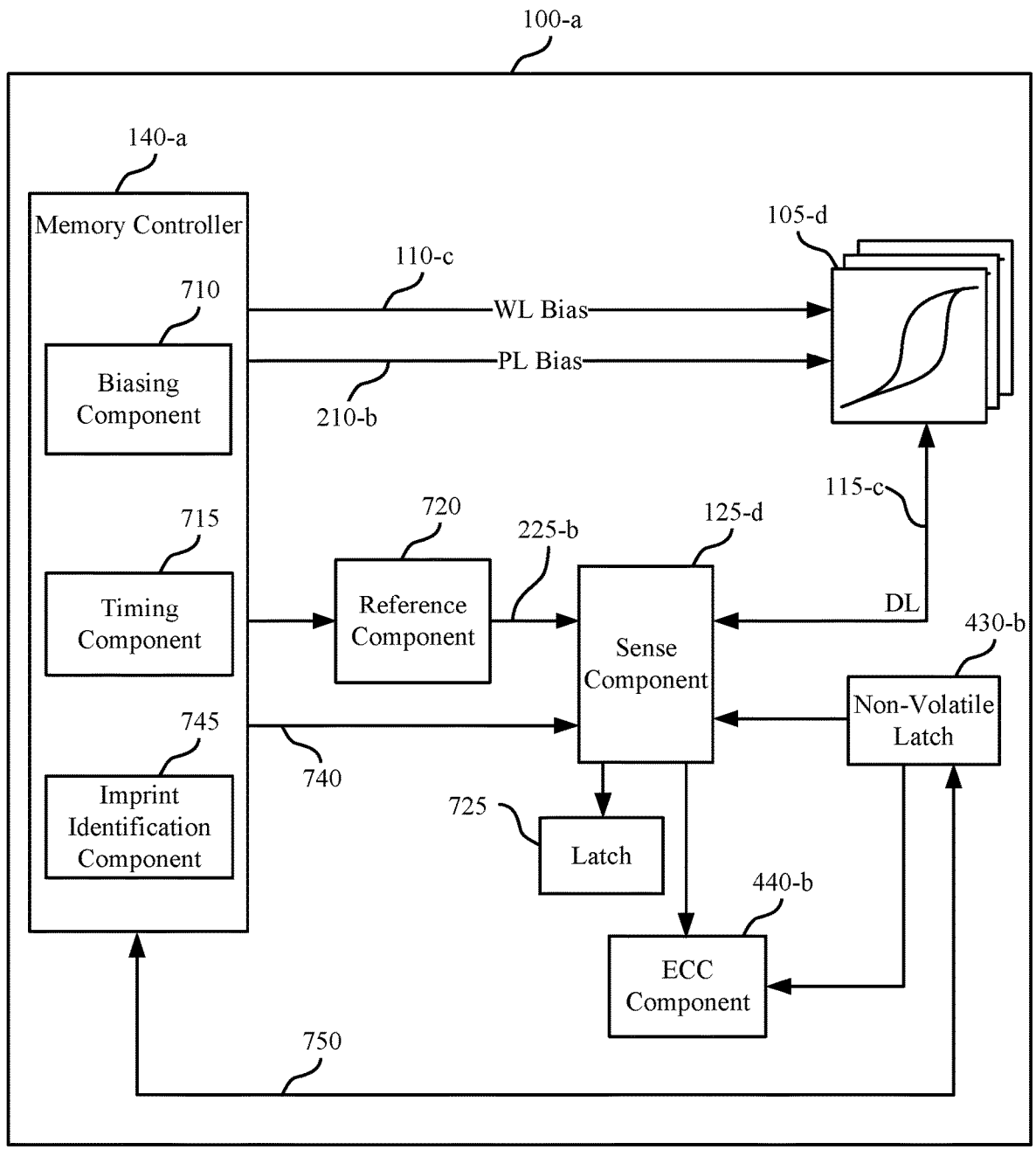
FIG. 7 illustrates a block diagram of an example ferroelectric memory array that supports avoiding imprint of a memory cell in accordance with various embodiments of the present disclosure.

FIG. 7 shows a block diagram 700 of a memory array 100-a that supports avoiding imprint in accordance with various embodiments of the present disclosure. Memory array 100-a may be referred to as an electronic memory apparatus and includes memory controller 140-a, and a memory cell 105-d, which may be examples of memory controller 140 and a memory cell 105 as described with reference to FIGS. 1, 2, and 4. In some cases, memory cell 105-d may be associated with multiple memory cells 105 as described with reference to FIG. 1. Memory controller 140-a may include biasing component 710, timing component 715, and imprint identification component 745 and may operate memory array 100-a as described in FIG. 1. Memory controller 140-a may also include a non-volatile latch 430-b and an ECC component 440-b, which may be examples of a non-volatile latch 430 and ECC component 440 as described with reference to FIG. 4.

Memory controller 140-a may be in electronic communication with word line 110-c, digit line 115-c, sense component 125-d, and plate line 210-b, which may be examples of word line 110, digit line 115, sense component 125, and plate line 210 described with reference to FIGS. 1, 2, and 4. Memory array 100-a may also include reference component 720 and latch 725. The components of memory array 100-a may be in electronic communication with each other and may perform the functions described with reference to FIGS. 1-5. In some cases, reference component 720, sense component 125-d, and latch 725 may be components of memory controller 140-a.

In some examples, digit line 115-c is in electronic communication with sense component 125-d and a ferroelectric capacitor of ferroelectric memory cell 105-d. Ferroelectric memory cell 105-d may be writable with a logic state (e.g., a first or second logic state). Word line 110-c may be in electronic communication with memory controller 140-a and a selection component of ferroelectric memory cell 105-d. Plate line 210-a may be in electronic communication with memory controller 140-a and a plate of the ferroelectric capacitor of ferroelectric memory cell 105-d. Sense component 125-d may be in electronic communication with memory controller 140-a, reference line 225-b, digit line 115-c, and latch 725. Reference component 720 may be in electronic communication with memory controller 140-a and reference line 225-b. Sense control line 740 may be in electronic communication with sense component 125-d and memory controller 140-a.

Latch control line 750 may be in electronic communication with non-volatile latch 430-b and memory controller 140-a. Non-volatile latch 430-b may be in electronic communication with ECC component 440-b and/or sense component 125-d. ECC component 440-b may be in electronic communication with sense component 125-d. These components may also be in electronic communication with other components, both inside and outside of memory array 100-a, in addition to components not listed above, via other components, connections, or busses.

Memory controller 140-a may be configured to activate word line 110-c, plate line 210-b, or digit line 115-c by applying voltages to those various nodes. For example, biasing component 710 may be configured to apply a voltage to operate memory cell 105-d to read or write memory cell 105-d as described above. In some cases, memory controller 140-a may include a row decoder, column decoder, or both, as described with reference to FIG. 1. This may enable memory controller 140-a to access one or more memory cells 105. Biasing component 710 may also provide voltage potentials to reference component 720 in order to generate a reference signal for sense component 125-d. Additionally, biasing component 710 may provide voltage potentials for the operation of sense component 125-d.

In some cases, memory controller 140-a may perform its operations using timing component 715. For example, timing component 715 may control the timing of the various word line selections or plate biasing, including timing for switching and voltage application to perform the memory functions, such as reading and writing, discussed herein. In some cases, timing component 715 may control the operations of biasing component 710. Reference component 720 may include various components to generate a reference signal for sense component 125-d. Reference component 720 may include circuitry configured to produce a reference signal. In some cases, reference component 720 may be implemented using other ferroelectric memory cells 105. Sense component 125-d may compare a signal from memory cell 105-d (through digit line 115-c) with a reference signal from reference component 720. Upon determining the logic state, the sense component may then store the output in latch 725, where it may be used in accordance with the operations of an electronic device that memory array 100-a is a part. Sense component 125-d may include a sense amplifier in electronic communication with the latch and the ferroelectric memory cell.

Non-volatile latch 430-b may include a non-volatile memory cell to store an indication of whether the first logic state or the second logic state represents an intended logic state of the ferroelectric memory cell 105-d. In some cases, non-volatile latch 430-b is implemented as a second ferroelectric memory cell different than ferroelectric memory cell 105-d (e.g., an unused ferroelectric memory cell).

Imprint identification component 745, in combination with timing component 715 and biasing component 710 may be used to write a first logic state to ferroelectric memory cell 105-d; determine that the ferroelectric memory cell 105-d has stored the first logic state for a first time period; and write a second logic state to the ferroelectric memory cell 105-d based at least in part on the determination that the ferroelectric memory cell 105-d has stored the first logic state for the first time period, wherein the second logic state is different from the first logic state. For instance, imprint identification component 745 may be used to determine a length of the first time period based at least in part on at least one of a temperature of the ferroelectric memory cell 105-d, an age of the ferroelectric memory cell 105-d, an average delay between access operations of the ferroelectric memory cell 105-d, or a sensing window resulting from reading the ferroelectric memory cell 105-d, or any combination thereof.

In some examples, memory controller 140-a may be used to operate components of memory array 100-a to maintain the performance of memory cell 105-d. For example, memory controller 140-a may use biasing component 710 to write a first logic state to ferroelectric memory cell 105-d; timing component 715 to determine that the ferroelectric memory cell has stored the first logic state for a first time period; and biasing component 710 to write a second logic state to ferroelectric memory cell 105-*d* based at least in part on the determination that ferroelectric memory cell 105-*d* has stored the first logic state for the first time period, wherein the second logic state is different from the first logic state. In some examples, an additional factor for writing the first logic state is identifying that ferroelectric memory cell 105-*d* has stored the first logic state for the first time period without being accessed. In some cases, the first time period is based at least in part on at least one of a temperature of the ferroelectric memory cell 105-*d*, an age of the ferroelectric memory cell 105-*d*, an average delay between access operations of the ferroelectric memory cell 105-*d*, or a sensing window resulting from reading the ferroelectric memory cell 105-*d*, or any combination thereof.

In some cases, non-volatile latch 430-*b* is used to store an indicator that indicates whether an intended logic state stored by ferroelectric memory cell 105-*d* is the first logic state or the second logic state. For instance, the value of the indicator stored at non-volatile latch 430-*b* may be updated (e.g., to a value of 1) based on writing the second value to ferroelectric memory cell 105-*d* indicate that the intended logic state of ferroelectric memory cell 105-*d* is the first logic state. The value of the indicator may be provided to sense component 125-*d*, and sense component 125-*d* may output the logic state of ferroelectric memory cell 105-*d* as the first logic state, despite ferroelectric memory cell 105-*d* storing the second logic state, as a result of the value of the indicator stored by non-volatile latch 430-*b*.

In another example, the value of the indicator may not be provided to sense component 125-*d* and ECC component 440-*b* may be used to determine the intended logic state of ferroelectric memory cell 105-*d*. For instance, ECC component 440-*b* may identify a codeword from a read operation of a page of the memory array, and a value of the codeword is based at least in part on the value of the indicator. ECC component 440-*b* may then determining that the intended logic state of the ferroelectric memory cell 105-*d* is the first logic state based at least in part on the identified codeword.

In some cases, memory controller 140-*a* may receive a request to store the first logic state in ferroelectric memory cell 105-*d*. Memory controller 140-*a* may use biasing component 710 in combination with the value of non-volatile latch 430-*b* in writing to ferroelectric memory cell 105-*d*. For instance, if the value stored by non-volatile latch 430-*b* is a 1, memory controller may determine that the logic state stored by ferroelectric memory cell 105-*d* been flipped, and may write the second logic state to ferroelectric memory cell 105-*d* in place of the first logic state. Similarly, memory controller 140-*a* may receive a request to store a page of data, and may write a flipped version of the page of data based on the value of non-volatile latch 430-*b*.

In some cases, memory controller 140-*a* may use timing component 715 to determine that ferroelectric memory cell 105-*d* has stored the second (e.g., flipped) logic state for a second time period, and may write back the first logic state to the ferroelectric memory cell 105-*d* based at least in part on determining that the ferroelectric memory cell 105-*d* has stored the second logic state for the second time period. Imprint identification component 745 may then trigger non-volatile latch 430-*b* to update the value of the indicator so that the indicator indicates that the intended logic state of ferroelectric memory cell 105-*d* is the logic state stored by ferroelectric memory cell 105-*d*, which in this case is the first logic state. In some cases, the first time period comprises a first interval of a cycle and the second time period comprises a second interval of the cycle, a period of the cycle comprising a time between writing the first logic state and writing back the first logic state.

In some cases, each ferroelectric memory cell of memory array 100-*a* is associated with a non-volatile latch, and the intended logic states of a subsection of memory array 100-*a* is based at least in part on the majority of the plurality of latches storing the same value. In some examples, memory controller 140-*a* uses imprint identification component 745, in combination with timing component 715, to identify a subsection of the memory array that includes the ferroelectric memory cell 105-*d*; and write different logic states to each ferroelectric memory cell of the subsection based at least in part on determining that one or more ferroelectric memory cells of the subsection has stored the first logic state for the first time period. An additional factor for writing the different logic states may be identifying that a ferroelectric memory cell of the ferroelectric memory cells has stored a logic state for the first time period without being accessed.

In some examples, memory controller 140-*a* writes the second logic state to ferroelectric memory cell 105-*d* independent of the first time period. For instance, memory controller 140-*a* may write the second logic state to ferroelectric memory cell 105-*d* based on at least one of determining that a number of errors has exceeded a threshold number; determining that the memory array has operated in a low power mode; determining that the memory array has operated in a powered down mode; or determining that a command from a user has been received, or any combination thereof. In another example memory controller 140-*a* may writing different logic states to each ferroelectric memory cell of the subsection based at least in part on activating a subsection of the memory array that includes ferroelectric memory cell 105-*d*.

Memory controller 140-*a* may also be used to measure a temperature of a memory array that includes the ferroelectric memory cell 105-*d*, wherein the first time period is based at least in part on the temperature, or monitor a number of access operations performed on the ferroelectric memory cell 105-*d*, wherein the first time period is based at least in part on the number of access operations of the ferroelectric memory cell 105-*d*, or both; and modify a value of the first time period based at least in part on the measured temperature or the monitored number of access operations, or both. Additionally, memory controller 140-*a* may be used to initiate a timer after the first logic state is written, a value of the timer used to determine that the ferroelectric memory cell 105-*d* has stored the first logic state for the first time period.

Figure 8:
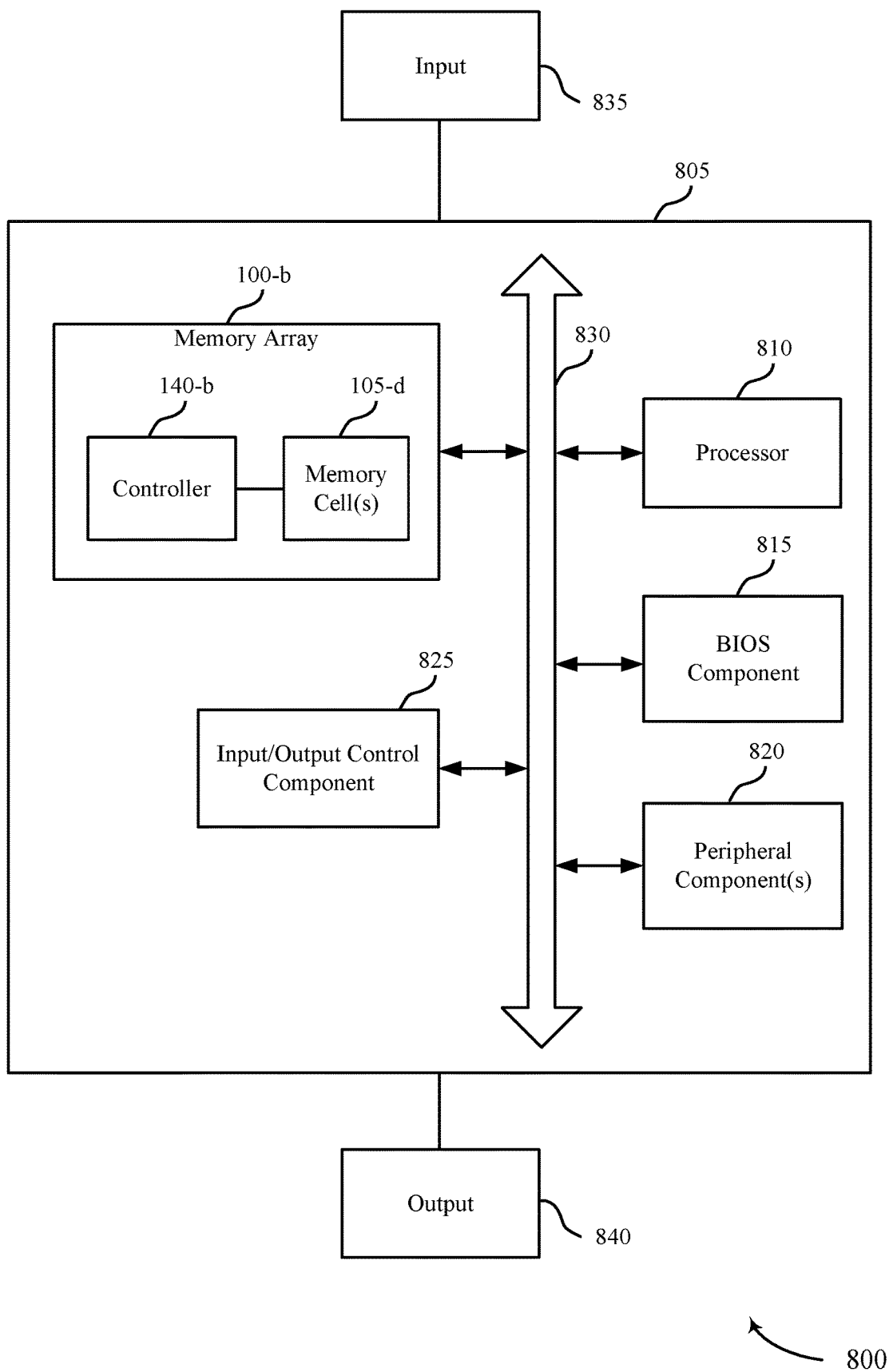
FIG. 8 illustrates a system, including a memory array, that supports avoiding imprint of a memory cell in accordance with various embodiments of the present disclosure.

FIG. 8 illustrates a system 800 that supports avoiding imprint of a memory cell in accordance with various embodiments of the present disclosure. System 800 includes a device 805, which may be or include a printed circuit board to connect or physically support various components. Device 805 may be a computer, laptop computer, notebook computer, tablet computer, mobile phone, or the like, in some examples. Device 805 includes a memory array 100-*b*, which may be an example of memory array 100 described with reference to FIGS. 1 and 7. Memory array 100-*b* may contain memory controller 140-*b* and memory cell(s) 105-*d*, which may be examples of memory controller 140 described with reference to FIGS. 1 and 7 and memory cells 105 described with reference to FIGS. 1, 2, 4, and 7. Device 805 may also include a processor 810, BIOS component 815, peripheral component(s) 820, and input/output control component 825. The components of device 805 may be in electronic communication with one another through bus 830.

Processor 810 may be configured to operate memory array 100-*a* through memory controller 140-*b*. In some cases, processor 810 may perform the functions of memory controller 140 described with reference to FIGS. 1 and 7. In other cases, memory controller 140-*b* may be integrated into processor 810. Processor 810 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 810 may perform various functions described herein, including recovery of a memory cell using fast cycling. Processor 810 may, for example, be configured to execute computer-readable instructions stored in memory array 100-*a* to cause device 805 perform various functions or tasks.

BIOS component 815 may be a software component that includes a basic input/output system (BIOS) operated as firmware, which may initialize and run various hardware components of system 800. BIOS component 815 may also manage data flow between processor 810 and the various components, e.g., peripheral components 820, input/output control component 825, etc. BIOS component 815 may include a program or software stored in read-only memory (ROM), flash memory, or any other non-volatile memory.

Peripheral component(s) 820 may be any input or output device, or an interface for such devices, that is integrated into device 805. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input/output control component 825 may manage data communication between processor 810 and peripheral component(s) 820, input devices 835, or output devices 840. Input/output control component 825 may also manage peripherals not integrated into device 805. In some cases, input/output control component 825 may represent a physical connection or port to the external peripheral.

Input 835 may represent a device or signal external to device 805 that provides input to device 805 or its components. This may include a user interface or interface with or between other devices. In some cases, input 835 may be a peripheral that interfaces with device 805 via peripheral component(s) 820 or may be managed by input/output control component 825.

Output 840 may represent a device or signal external to device 805 configured to receive output from device 805 or any of its components. Examples of output 840 may include a display, audio speakers, a printing device, another processor or printed circuit board, etc. In some cases, output 840 may be a peripheral that interfaces with device 805 via peripheral component(s) 820 or may be managed by input/output control component 825.

The components of memory controller 140-*b*, device 805, and memory array 100-*b* may be made up of circuitry designed to carry out their functions. This may include various circuit elements, for example, conductive lines, transistors, capacitors, inductors, resistors, amplifiers, or other active or inactive elements, configured to carry out the functions described herein.

Figure 9:
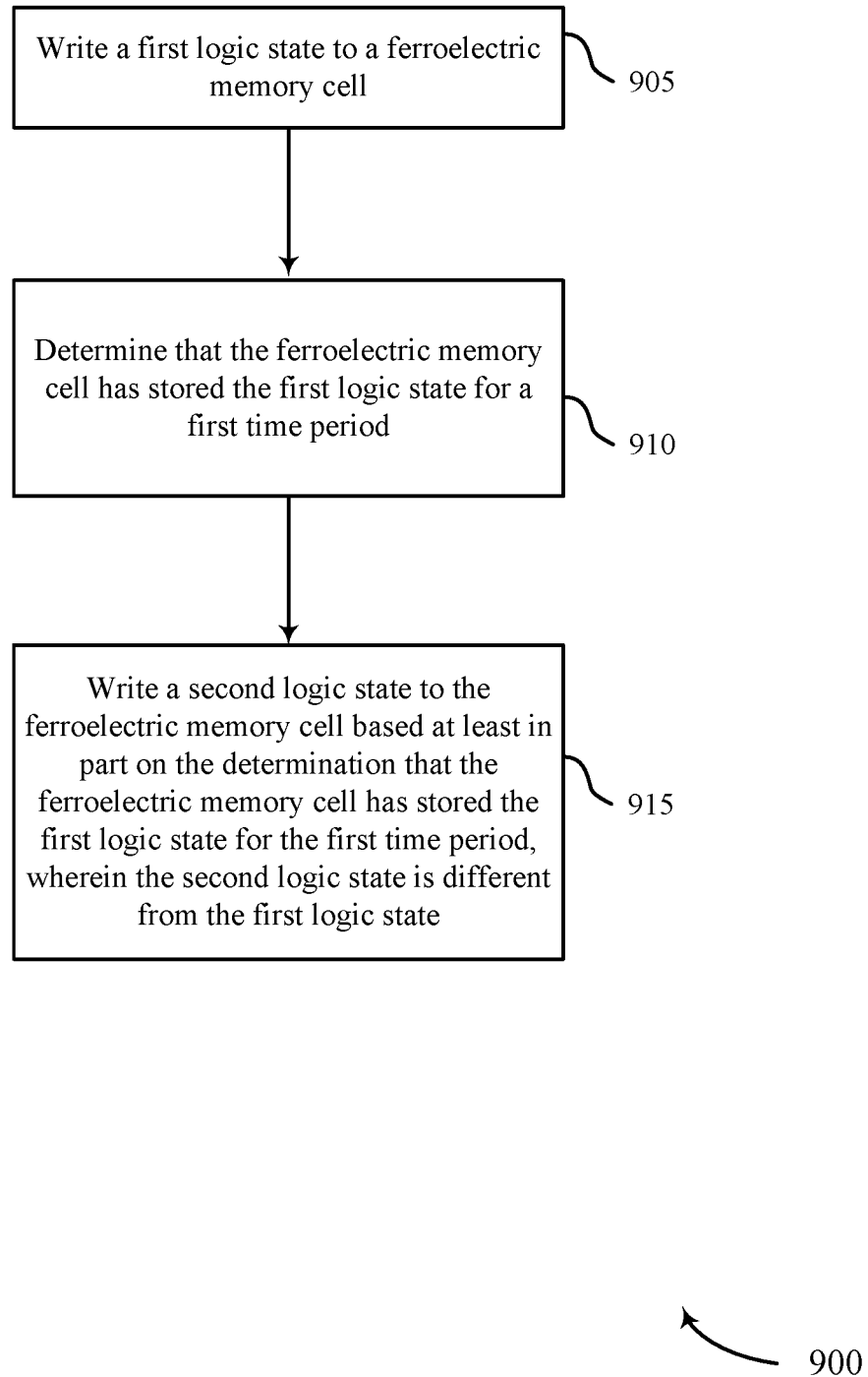
FIG. 9 is a flowchart that illustrates a method or methods for avoiding imprint of a memory cell in accordance with various embodiments of the present disclosure.

FIG. 9 shows a flowchart illustrating a method 900 for avoiding imprint of a memory cell in accordance with various embodiments of the present disclosure. The operations of method 900 may be implemented by a memory array 100, as described with reference to FIGS. 1, 7, and 8. For example, the operations of method 900 may be performed by a memory controller 140 as described with reference to FIGS. 1, 7, and 8. In some examples, a memory controller 140 may execute a set of codes to control the functional elements of the memory array 100 to perform the functions described below. Additionally or alternatively, the memory controller 140 may perform features the functions described below using special-purpose hardware.

At block 905, the method may include writing a first logic state to a ferroelectric memory cell, as described with reference to FIGS. 1-5. In certain examples, the operations of block 905 may be performed or facilitated by the biasing component 710, as described with reference to FIG. 7.

At block 910, the method may include determining that the ferroelectric memory cell has stored the first logic state for a first time period, as described with reference to FIGS. 1-5. In certain examples, the operations of block 910 may be performed or facilitated by the imprint identification component 745, as described with reference to FIG. 7. In some cases, the first time period is based at least in part on at least one of a temperature of the ferroelectric memory cell, an age of the ferroelectric memory cell, an average delay between access operations of the ferroelectric memory cell, or a sensing window resulting from reading the ferroelectric memory cell, or any combination thereof.

In some cases, the determining may include identifying that the ferroelectric memory cell has stored the first logic state for the first time period without being accessed, wherein writing the second logic state is based at least in part on the identifying. In other cases, determining that the first time period has elapsed may not be associated with a value of a timer, but instead may be determined based on determining that a number of errors has exceeded a threshold number; determining that the memory array has operated in a low power mode; determining that the memory array has operated in a powered down mode; or determining that a command from a user has been received, or any combination thereof.

At block 915, the method may include writing a second logic state to the ferroelectric memory cell based at least in part on the determination that the ferroelectric memory cell has stored the first logic state for the first time period, wherein the second logic state is different from the first logic state, as described with reference to FIGS. 1-5. In certain examples, the operations of block 915 may be performed or facilitated by the biasing component 710, as described with reference to FIG. 7. In some cases, the second logic state is opposite the first logic state. In some examples, the method may include storing an indicator in a latch, wherein a value of the indicator indicates whether an intended logic state of the ferroelectric memory cell is the first logic state or the second logic state. In some examples, the latch comprises one latch of a plurality of latches, and wherein the intended logic state of the ferroelectric memory cell is based at least in part on the value being stored by a majority of the plurality of latches. In another example, the second logic state may be written based on activating a subsection of the memory array that includes the ferroelectric memory cell. In some cases, the method may include updating the value of the indicator based at least in part on writing the second logic state to the ferroelectric memory cell, wherein the updated value of the indicator indicates that the intended logic state of the ferroelectric memory cell is the first logic state.

In some examples, the method may include sensing the second logic state of the ferroelectric memory cell with a sense component that is in electronic communication with the ferroelectric memory cell, and determining that the intended logic state of the ferroelectric memory cell is the first logic state based at least in part on sensing the second logic state and the value of the indicator. Additionally or alternatively, the method may include identifying a codeword from a read operation of the memory array, wherein a value of the codeword is based at least in part on the value of the indicator; and determining that the intended logic state of the ferroelectric memory cell is the first logic state based at least in part on the codeword.

In some cases, the method may include determining that the ferroelectric memory cell has stored the second logic state for a second time period, and writing back the first logic state to the ferroelectric memory cell based at least in part on determining that the ferroelectric memory cell has stored the second logic state for the second time period. The value of the indicator may be updated based at least in part on writing the first logic state to the ferroelectric memory cell, wherein the updated value of the indicator indicates that the intended logic state of the ferroelectric memory cell is the first logic state. In some cases, the first time period comprises a first interval of a cycle and the second time period comprises a second interval of the cycle, a period of the cycle comprising a time between writing the first logic state and writing back the first logic state.

In some examples, the method may include, identifying a subsection of the memory array that includes the ferroelectric memory cell, and writing different logic states to each ferroelectric memory cell of the subsection based at least in part on determining that one or more ferroelectric memory cells of the subsection has stored the first logic state for the first time period. In some examples, the method may include receiving the first logic state for storage in the ferroelectric memory cell, and writing the second logic state to the ferroelectric memory cell based at least in part on the value of the indicator. In this way, the logic state of the ferroelectric memory cell may retain proper polarity within a flipped page.

Thus, method 900 may be a method of operating a memory array. For example, it may provide for avoiding imprint of a memory cell. It should be noted that method 900 describes possible implementations, and the operations and steps may be rearranged or otherwise modified such that other implementations are possible.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The description set forth herein, in connection with the appended drawings, describes example configurations and does not represent all the examples that may be implemented or that are within the scope of the claims. The terms "example," "exemplary," and "embodiment," as used herein, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. When the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (OV) but that is not directly connected with ground. Accordingly, the voltage of a virtual ground may temporarily fluctuate and return to approximately OV at steady state. A virtual ground may be implemented using various electronic circuit elements, such as a voltage divider consisting of operational amplifiers and resistors. Other implementations are also possible. "Virtual grounding" or "virtually grounded" means connected to approximately OV.

The term "electronic communication" refers to a relationship between components that supports electron flow between the components. This may include a direct connection between components or may include intermediate components. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

The term "isolated" refers to a relationship between components in which electrons are not presently capable of flowing between them; components are isolated from each other if there is an open circuit between them. For example, two components physically connected by a switch may be isolated from each other when the switch is open.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A method, comprising:
   determining that a first time period has elapsed, wherein a memory cell stores a first logic value during at least a portion of the first time period, and wherein the first logic value is an intended logic value of the memory cell; and
   writing, to the memory cell, a second logic value different than the first logic value based at least in part on determining that the first time period has elapsed.

2. The method of claim 1, further comprising:
   determining that the memory cell has stored the first logic value, wherein the second logic value is written to the memory cell based at least in part on determining that the memory cell has stored the first logic value.

3. The method of claim 1, further comprising:
   determining that the memory cell has stored the first logic value without being accessed, wherein the second logic value is written to the memory cell based at least in part on determining that the memory cell has stored the first logic value without being accessed.

4. The method of claim 1, further comprising:
   determining that the memory cell has stored the second logic value; and
   writing the first logic value to the memory cell based at least in part on determining that the memory cell has stored the second logic value.

5. The method of claim 1, further comprising:
   identifying a plurality of memory cells comprising the memory cell; and
   writing different logic values to each memory cell of the plurality of memory cells based at least in part on determining that one or more of the plurality of memory cells has stored a logic value for the first time period.

6. The method of claim 1, wherein determining the first time period has elapsed comprises:
   determining that a number of errors has exceeded a threshold number;

determining that a memory array comprising the memory cell has entered an activated state from a low power mode;

determining that the memory array comprising the memory cell has entered the activated state from a powered down mode;

determining that a command from a user has been received; or any combination thereof.

7. The method of claim 1, wherein the first time period is based at least in part on at least one of a temperature of the memory cell, an age of the memory cell, an average delay between access operations of the memory cell, or a sensing window resulting from reading the memory cell, or a combination thereof.

8. The method of claim 1, wherein the memory cell comprises a ferroelectric material.

9. An apparatus, comprising:
a memory cell configured to store a logic value; and
a latch configured to store, based at least in part on an elapsed time period, an indication of whether the logic value stored on the memory cell represents an intended logic value of the memory cell.

10. The apparatus of claim 9, wherein the apparatus is configured to write, to the memory cell, a second logic value different than the logic value based at least in part on the elapsed time period, and the latch is configured to store the indication based on the second logic value being written to the memory cell.

11. The apparatus of claim 9, further comprising:
a sense amplifier coupled to the latch and the memory cell.

12. The apparatus of claim 9, further comprising:
an error correction code (ECC) component coupled to the latch and an output of a sense amplifier.

13. The apparatus of claim 9, wherein the memory cell comprises a ferroelectric material.

14. An apparatus, comprising:
a memory array comprising a plurality of memory cells; and
a memory controller coupled with the memory array and operable to cause the apparatus to:
determine that a first time period has elapsed, wherein a memory cell stores a first logic value during at least a portion of the first time period, and wherein the first logic value is an intended logic value of the memory cell; and write, to the memory cell, a second logic value different than the first logic value based at least in part on determining that the first time period has elapsed.

15. The apparatus of claim 14, wherein the controller is operable to cause the apparatus to:
determine that the memory cell has stored the first logic value, wherein the second logic value is written to the memory cell based at least in part on determining that the memory cell has stored the first logic value.

16. The apparatus of claim 14, wherein the controller is operable to cause the apparatus to:
determine that the memory cell has stored the first logic value without being accessed, wherein the second logic value is written to the memory cell based at least in part on determining that the memory cell has stored the first logic value without being accessed.

17. The apparatus of claim 14, wherein the controller is operable to cause the apparatus to:
determine that the memory cell has stored the second logic value; and
write the first logic value to the memory cell based at least in part on determining that the memory cell has stored the second logic value.

18. The apparatus of claim 14, wherein the controller is operable to cause the apparatus to determine the first time period has elapsed by causing the apparatus to:
determine that a number of errors has exceeded a threshold number;
determine that a memory array comprising the memory cell has entered an activated state from a low power mode;
determine that the memory array has entered the activated state from a powered down mode;
determine that a command from a user has been received; or
any combination thereof.

19. The apparatus of claim 14, wherein the first time period is based at least in part on at least one of a temperature of the memory cell of the plurality of memory cells, an age of the memory cell, an average delay between access operations of the memory cell, or a sensing window resulting from reading the memory cell, or a combination thereof.

20. The apparatus of claim 14, wherein each memory cell of the plurality of memory cells comprises a ferroelectric material.

* * * * *